(12) United States Patent
Kim et al.

(10) Patent No.: US 11,849,281 B2
(45) Date of Patent: Dec. 19, 2023

(54) APPARATUS

(71) Applicant: LG Display Co., Ltd., Seoul (KR)

(72) Inventors: Giyoun Kim, Paju-si (KR); Eun Roh, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 17/878,906

(22) Filed: Aug. 2, 2022

(65) Prior Publication Data

US 2023/0209275 A1 Jun. 29, 2023

(30) Foreign Application Priority Data

Dec. 23, 2021 (KR) .......................... 10-2021-0186124

(51) Int. Cl.
*H04R 17/00* (2006.01)
*H04R 1/02* (2006.01)
*H05K 5/00* (2006.01)

(52) U.S. Cl.
CPC ............ *H04R 17/00* (2013.01); *H04R 1/028* (2013.01); *H04R 2499/15* (2013.01); *H05K 5/0018* (2022.08)

(58) Field of Classification Search
CPC ...................................................... H04R 17/00
See application file for complete search history.

(56) References Cited

U.S. PATENT DOCUMENTS

| | | | |
|---|---|---|---|
| 10,671,114 B2* | 6/2020 | Ahn | H04R 7/045 |
| 2013/0167881 A1* | 7/2013 | Korbler | H10N 30/092 |
| | | | 29/25.35 |
| 2015/0212549 A1* | 7/2015 | Shin | G02F 1/1368 |
| | | | 361/679.26 |
| 2017/0306190 A1* | 10/2017 | Garcia-Miralles | C09D 11/52 |
| 2020/0233629 A1* | 7/2020 | Yeon | G10K 9/125 |
| 2022/0238787 A1* | 7/2022 | Kagawa | H10N 30/883 |

* cited by examiner

*Primary Examiner* — Olisa Anwah
(74) *Attorney, Agent, or Firm* — Morgan, Lewis & Bockius LLP

(57) ABSTRACT

An apparatus includes a display member configured to display an image, a front member at a front surface of the display member, a vibration apparatus at a rear surface of the display member, and an adhesive member between the display member and the front member, the adhesive member including a piezoelectric material.

38 Claims, 6 Drawing Sheets

APPARATUS

CROSS-REFERENCE TO RELATED APPLICATIONS

This application claims the benefit of the Korean Patent Application No. 10-2021-0186124 filed on Dec. 23, 2021, which is hereby incorporated by reference as if fully set forth herein.

BACKGROUND

Technical Field

The present disclosure relates to an apparatus.

Discussion of the Related Art

Apparatuses include a display member for displaying an image and a sound device for outputting a sound associated with the image displayed by the display member. In apparatuses, a screen is progressively enlarged, but the demand for lightness and thinness is increasing. However, because apparatuses should include a sufficient space where a sound device such as a speaker for outputting a sound is embedded, it is difficult to implement lightness and thinness. Also, a sound generated by a sound device embedded in an apparatus is output in a direction toward a rear surface or a lateral surface of a main body of the apparatus instead of a front surface of a display member, and due to this, does not travel toward a viewer or a user, watching an image, of a forward region with respect to the front surface of the display member, causing a problem where the immersion experience of a viewer watching an image is hindered.

Moreover, a speaker applied to apparatuses may be, for example, an actuator including a coil and a magnet. However, in a case where the actuator is applied to apparatuses, there is a drawback where a thickness is thick. Piezoelectric devices enabling implementation of a thin thickness are attracting much attention. Because piezoelectric devices have a fragile characteristic, the piezoelectric devices are easily damaged by an external impact, and due to this, there is a problem where the reliability of sound reproduction is low.

SUMMARY

Accordingly, the inventors have recognized the above-described problems and have performed various experiments for allowing a sound to travel in a forward direction of an apparatus and enhancing the quality of a sound. Through the various experiments, the inventors have invented a new apparatus for allowing a sound to travel in a forward direction of the apparatus and enhancing a sound pressure level characteristic and/or a sound characteristic.

Accordingly, embodiments of the present disclosure are directed to an apparatus that substantially obviates one or more of the problems due to limitations and disadvantages of the related art.

An aspect of the present disclosure is to provide an apparatus which may vibrate a display member to output a sound in a forward direction of the apparatus and may enhance the quality of a sound.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, an apparatus comprises a display member configured to display an image, a front member at a front surface of the display member, a vibration apparatus at a rear surface of the display member, and an adhesive member between the display member and the front member, the adhesive member including a piezoelectric material.

In another aspect, an apparatus comprises a display member including a plurality of pixels arranged over a flexible substrate, a vibration apparatus under the display member, a front member at the display member, and a vibration transfer member between the display member and the front member, the vibration transfer member including a piezoelectric material.

In another aspect, an apparatus according to another embodiment of the present disclosure comprises a display panel configured to display an image and a vibration apparatus at a rear surface of the display panel. A supporting member may be between a rear surface of the display panel and the vibration apparatus. A first adhesive member may be between the display panel and the supporting member, the first adhesive member including a piezoelectric material.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure.

It is to be understood that both the foregoing general description and the following detailed description are exemplary and explanatory, and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure.

Figure 1:
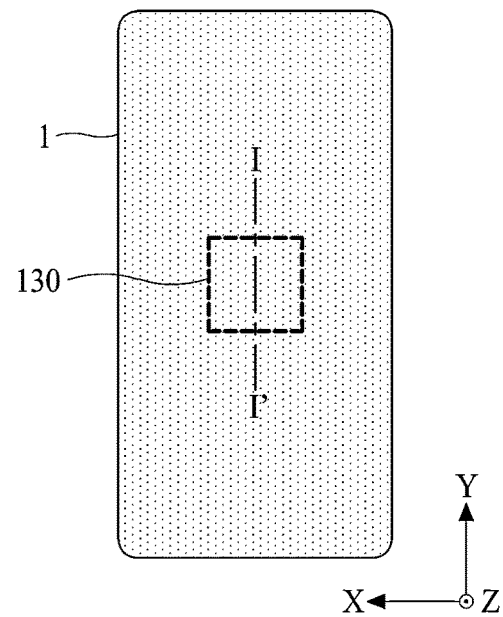
FIG. 1 illustrates an apparatus according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations may unnecessarily obscure aspects of the present disclosure, the detailed description thereof may be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals refer to like elements throughout unless stated otherwise. Names of the respective elements used in the following explanations are selected only for convenience of writing the specification and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and completely convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, embodiments of the present disclosure are not limited to the illustrated details. Like reference numerals refer to like elements throughout. In the following description, when the detailed description of the relevant known function or configuration is determined to unnecessarily obscure the important point of the present disclosure, the detailed description will be omitted. When the terms "comprise," "have," and "include," "contain," "constitute," "make up of" "formed of," and the like are used, one or more other elements may be added unless the term, such as "only" is used. The terms of a singular form may include plural forms unless the context clearly indicates otherwise.

In construing an element, the element is construed as including an error or tolerance range even where no explicit description of such an error or tolerance range is provided.

In describing a position relationship, for example, when a position relation between two parts is described using "on," "over," "under," "above," "below," "beneath," "near," "close to," or "adjacent to," "beside," "next to," or the like, one or more other parts may be disposed between the two parts unless a more limiting term, such as "immediate(ly)," "direct(ly)," or "close(ly)" is used. For example, when a structure is described as being positioned "on," "over," "under," "above," "below," "beneath," "near," "close to," or "adjacent to," "beside," or "next to" another structure, this description should be construed as including a case in which the structures contact each other as well as a case in which a third structure is disposed or interposed therebetween. Furthermore, the terms "front," "rear," "left," "right," "top," "bottom," "downward," "upward," "upper," "lower," and the like refer to an arbitrary frame of reference.

In describing a time relationship, for example, when the temporal order is described as "after," "subsequent," "next," "before," "prior to," or the like, a case that is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," "A," "B," "(a)," "(b)," or the like may be used. These terms are intended to identify the corresponding elements from the other elements, and basis, order, or number of the corresponding elements should not be limited by these terms. The expression that an element is "connected," "coupled," or "adhered" to another element or layer, the element or layer can not only be directly connected or adhered to another element or layer, but also be indirectly connected or adhered to another element or layer with one or more intervening elements or layers disposed or interposed between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings. Also, for convenience of description, a scale of each of elements illustrated in the accompanying drawings differs from a real scale, and thus, is not limited to a scale illustrated in the drawings.

Figure 2:
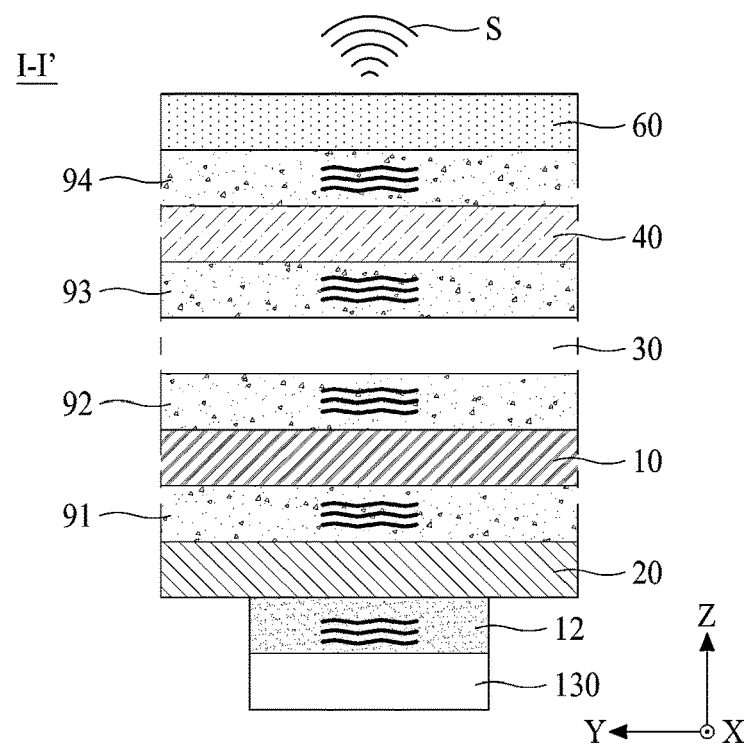
FIG. 2 is a cross-sectional view taken along line I-I' of FIG. 1.

FIG. 1 illustrates an apparatus according to an embodiment of the present disclosure. FIG. 2 is a cross-sectional view taken along line I-I' of FIG. 1.

Referring to FIGS. 1 and 2, the apparatus 1 according to an embodiment of the present disclosure may include a display member and a vibration apparatus 130. But an embodiment of the present disclosure is not limited thereto. For example, the apparatus 1 according to an embodiment of the present disclosure may include a vibration object other than the display member and the vibration apparatus 130. The display member may include a display panel, but the terms are not limited thereto.

The apparatus 1 according to an embodiment of the present disclosure may be a display apparatus. For example, the apparatus 1 may include a display apparatus, including a display panel 30 of the display member and a driver for driving the display panel 30, such as an organic light emitting display (OLED) apparatus or a liquid crystal display (LCD). Also, the apparatus 1 may include a set device (or a set apparatus) or a set electronic apparatus such as a notebook computer, a television (TV), a computer monitor, an equipment apparatus including an automotive apparatus or another type apparatus for vehicles, or a mobile electronic apparatus such as a smartphone or an electronic pad, which is a complete product (or a final product) including an LCD apparatus or an OLED apparatus.

Therefore, in an embodiment of the present disclosure, the display apparatus may include a display apparatus, such as an LCD apparatus or an OLED apparatus, and a set apparatus which is a final consumer device or an application product including the LCD apparatus or the OLED apparatus.

In some embodiments, an LCD apparatus or an OLED apparatus including a display panel and a driver may be referred to as a display apparatus, and an electronic apparatus which is a final product including an LCD apparatus or an OLED apparatus may be referred to as a set apparatus. For example, the display apparatus may include a display member including the display panel 30 and a source printed circuit board (PCB) which is a controller for driving the display panel 30. The set apparatus may further include a set PCB which is a set controller electrically connected to the source PCB to overall control the set apparatus.

A display panel applied to an embodiment of the present disclosure may use all types of display panels such as a liquid crystal display panel, an organic electroluminescent display panel, and an electroluminescent display panel, but embodiments of the present disclosure are not limited thereto. For example, the display panel may be a display panel which is vibrated by the vibration apparatus according to an embodiment of the present disclosure to generate a sound. A shape or a size of a display panel applied to a display apparatus according to embodiments of the present disclosure are not limited thereto.

The display panel may further include a backing such as a display panel metal plate. However, embodiments of the present disclosure are not limited thereto and the display panel may further include another rear structure including another material.

The display member may display an image (for example, an electronic image or a digital image). For example, the display member may output light to display an image. The display panel 30 of the display member may be a curved display panel or one of all types of display panels such as a liquid crystal display panel, an organic light emitting display panel, a quantum dot light emitting display panel, a micro light emitting diode display panel, and an electrophoretic display panel. The display panel 30 may be a flexible display panel. For example, the display panel 30 may be a flexible light emitting display panel, a flexible electrophoretic display panel, a flexible electro-wetting display panel, a flexible light emitting diode display panel, or a flexible quantum dot light emitting display panel, but embodiments of the present disclosure are not limited thereto.

The display panel 30 according to an embodiment of the present disclosure may include a display area which displays an image based on driving of a plurality of pixels. Also, the display panel 30 may include a non-display area which surrounds the display area AA, but embodiments of the present disclosure are not limited thereto.

The display panel 30 according to an embodiment of the present disclosure may include a first substrate, a second substrate, and a liquid crystal layer. The first substrate may be an upper substrate or a thin film transistor (TFT) array substrate. For example, the display panel 30 may include the first substrate including a TFT which is a switching element for adjusting a light transmittance of each pixel, the second substrate including a color filter and/or a black matrix, and a liquid crystal layer between the first substrate and the second substrate. For example, the first substrate may include a pixel array portion (or a display portion or a display area) including a plurality of pixels which are respectively provided in a plurality of pixel areas defined by intersections between a plurality of gate lines and/or a plurality of data lines. Each of the plurality of pixels may include a TFT connected to a gate line and/or a data line, a pixel electrode connected to the TFT, and a common electrode which is provided adjacent to the pixel electrode and is supplied with a common voltage.

The first substrate may further include a pad portion provided at a first edge (or a first periphery or a first non-display portion) thereof and a gate driving circuit provided at a second edge (or a second periphery or a second non-display portion) thereof.

The pad portion may transfer a signal, supplied from the outside, to the pixel array and/or the gate driving circuit. For example, the pad portion may include a plurality of data pads connected to a plurality of data lines through a plurality of data link lines and a plurality of gate input pads connected to the gate driving circuit through a gate control signal line. For example, a size of the first substrate may be greater than that of the second substrate, but embodiments of the present disclosure are not limited thereto.

The gate driving circuit may be embedded (or integrated) into the second edge (or the second periphery) of the first substrate and may be connected to the plurality of gate lines. For example, the gate driving circuit may be implemented with a shift register including a transistor, which is formed through the same process as the TFT provided in the pixel area. According to another embodiment of the present disclosure, the gate driving circuit may be implemented as an integrated circuit (IC) and may be provided in a panel driving circuit, without being embedded into the first substrate.

The second substrate may be a lower substrate or a color filter array substrate. For example, the second substrate may include a pixel, including an opening area overlapping the pixel area formed in the second substrate, and a color filter layer formed in the opening area. The second substrate may have a size which is less than that of the first substrate, but embodiments of the present disclosure are not limited thereto. For example, the second substrate may overlap a portion, other than the first edge (or the first periphery), of the first substrate. The second substrate may be bonded to a portion, other than the first edge, of the first substrate with a liquid crystal layer therebetween by a sealant.

The liquid crystal layer may be disposed between the first substrate and the second substrate. The liquid crystal layer may include a liquid crystal including liquid crystal molecules where an alignment direction thereof is changed based on an electric field generated by the common voltage and a data voltage applied to a pixel electrode for each pixel.

The display panel 30 according to an embodiment of the present disclosure may drive the liquid crystal layer based on the electric field which is generated in each pixel by the data voltage and the common voltage applied to each pixel, and thus, may display an image based on light passing through the liquid crystal layer.

According to another embodiment of the present disclosure, in the display panel 30, the first substrate may be implemented as the color filter array substrate, and the second substrate may be implemented as the TFT array substrate. For example, the display panel 30 according to another embodiment of the present disclosure may have a type where the display panel 30 according to an embodiment of the present disclosure is reversed. In this case, a pad portion of the display panel 30 according to another embodiment of the present disclosure may be covered by a separate mechanism.

The display panel 30 according to another embodiment of the present disclosure may include a bending portion which is bent or curved to have a curved shape or a certain curvature radius.

The bending portion of the display panel 30 may be provided in at least one of one edge (or one periphery) and the other edge (or the other periphery) of the display panel 30 which are parallel to each other. The one edge and/or the other edge, where the bending portion is provided, of the display panel 30 may include only the non-display area, or may include an edge of the display area and the non-display area. Here, the display panel 30 including the bending portion provided by bending of the non-display area may have a one-side bezel bending structure or a both-side bezel bending structure. Also, the display panel 100 including the bending portion provided by bending of the non-display area and the edge of the display area may have a one-side active bending structure or a both-side active bending structure.

When the display panel 30 is an organic light emitting display panel, the display panel 30 may include a plurality of gate lines, a plurality of data lines, and a plurality of pixels respectively provided in a plurality of pixel areas defined by intersections of the gate lines and the data lines. Also, the display panel 30 may include an array substrate including a TFT which is an element for selectively applying a voltage to each of the pixels, an organic light emitting device layer on the array substrate, and an encapsulation substrate disposed on the array substrate to overlay the organic light emitting device layer. The encapsulation substrate may protect the TFT and the organic light emitting device layer from an external impact and may prevent water or oxygen from penetrating into the organic light emitting device layer. Also, a layer provided on the array substrate may include an inorganic light emitting layer (for example, a nano-sized material layer, a quantum dot, or the like). As another example, the layer provided on the array substrate may include a micro light emitting diode.

The display panel 30 according to an embodiment of the present disclosure may display an image in a type such as a top emission type, a bottom emission type, or a dual emission type, based on a structure of a pixel array layer which includes an anode electrode, a cathode electrode, and a light emitting device and includes a plurality of pixels. In the top emission type, visible light emitted from the pixel array layer may be irradiated in a forward direction of a base substrate to allow an image to be displayed, and in the bottom emission type, the visible light emitted from the pixel array layer may be irradiated in a rearward region of the base substrate to allow an image to be displayed.

The display panel 30 according to an embodiment of the present disclosure may include a pixel array portion disposed in the display area of the substrate. The pixel array portion may include a plurality of pixels which display an image based on a signal supplied through each of signal lines. The signal lines may include a gate line, a data line, and a pixel driving power line, but embodiments of the present disclosure are not limited thereto.

Each of the plurality of pixels may include a pixel circuit layer including a driving TFT provided in a pixel area which is configured by a plurality of gate lines and/or a plurality of data lines, an anode electrode electrically connected to the driving TFT, a light emitting device disposed on the anode electrode, and a cathode electrode electrically connected to the light emitting device.

The driving TFT may be provided in a transistor region of each pixel area provided in a substrate. The driving TFT may include a gate electrode, a gate insulation layer, a semiconductor layer, a source electrode, and a drain electrode. The semiconductor layer of the driving TFT may include silicon such as amorphous silicon (a-Si), polysilicon (poly-Si), or low temperature poly-Si or may include oxide such as indium-gallium-zinc-oxide (IGZO), but embodiments of the present disclosure are not limited thereto.

The anode electrode (or a pixel electrode) may be provided in the opening region disposed in each pixel area and may be electrically connected to the driving TFT.

The light emitting device according to an embodiment of the present disclosure may include an organic light emitting device layer provided on the anode electrode. The organic light emitting device layer may be implemented so that pixels emit light of the same color (for example, white light) or emit lights of different colors (for example, red light, green light, and blue light). The cathode electrode (or a common electrode) may be connected to the organic light emitting device layer provided in each pixel area in common. For example, the organic light emitting device layer may include a single structure, which includes the same color for each pixel, or a stack structure which includes two or more structures. In another embodiment of the present disclosure, the organic light emitting device layer may include a stack structure which includes two or more structures including one or more different colors for each pixel. The two or more structures including one or more different colors may be configured with one or more of blue, red, yellow-green, and green or a combination thereof, but embodiments of the present disclosure are not limited thereto. For example, the combination may be blue and red, red and yellow-green, red and green, and red/yellow/green, but embodiments of the present disclosure are not limited thereto. Also, the present disclosure may be applied regardless of a stack order thereof. A stack structure including two or more structures having the same color or one or more different colors may further include a charge generating layer between two or more structures. The charge generating layer may have a PN junction structure and may include an N-type charge generating layer and a P-type charge generating layer.

According to another embodiment of the present disclosure, the light emitting device may include a micro light emitting diode device which is electrically connected to each of the anode electrode and the cathode electrode. The micro light emitting diode device may be a light emitting diode implemented as an IC (integrated circuit) type or a chip type. The micro light emitting diode device may include a first terminal electrically connected to the anode electrode and a second terminal electrically connected to the cathode electrode. The cathode electrode may be connected to a second terminal of the micro light emitting diode device provided in each pixel area in common. As another example, the light emitting device may include a quantum dot light emitting layer, but embodiments of the present disclosure are not limited thereto.

An encapsulation portion may be formed on the substrate to surround the pixel array portion, and thus, may prevent oxygen or water from penetrating into the light emitting device of the pixel array portion. The encapsulation portion according to an embodiment of the present disclosure may be formed in a multi-layer structure where an organic material layer and an inorganic material layer are alternately stacked, but embodiments of the present disclosure are not limited thereto. The inorganic material layer may prevent oxygen or water from penetrating into the light emitting device of the pixel array portion. The organic material layer may be formed to have a thickness which is relatively thicker than that of the inorganic material layer, so as to overlay particles occurring in a manufacturing process, but embodiments of the present disclosure are not limited thereto. For example, the encapsulation portion may include a first inorganic layer, an organic layer on the first inorganic layer, and a second inorganic layer on the organic layer. The organic layer may be a particle covering (or overlaying) layer, but the terms are not limited thereto. A touch panel may be disposed on the encapsulation portion, or may be disposed on a rear surface of the pixel array portion or in the pixel array portion. Hereinafter, an example where the display panel 30 is an electroluminescent display panel will be described, but embodiments of the present disclosure are not limited thereto.

According to an embodiment of the present disclosure, the vibration apparatus 130 may be disposed at a rear surface of the display member 30. The vibration apparatus 130 may vibrate the display member 30 at the rear surface of the display member 30 to provide a user with a sound S and/or a haptic feedback based on a vibration of the display member 30. According to an embodiment of the present disclosure, the vibration apparatus 130 may vibrate based on a vibration driving signal synchronized with an image displayed by the display member 30 to vibrate the display member 30. But the embodiments of the present disclosure are not limited thereto. For example, the vibration driving signal may also be independent from the image displayed by the display member 30.

For example, the display panel 30 may include a plurality of pixels which are arranged on a flexible substrate. The substrate may include a plastic material, but embodiments of the present disclosure are not limited thereto. For example, the substrate may include polyimide (PI), polyethylene terephthalate (PET), polyethylene naphthalate (PEN), polycarbonate (PC), polyethersulfone (PES), polyarylate (PAR), polysulfone (PSF), and cyclic-olefin copolymer (COC). The substrate according to an embodiment of the present disclosure is not limited to the plastic material and may include thin glass capable of being folded.

The vibration apparatus 130 may be disposed at a center of the display member or the apparatus 1. For example, the vibration apparatus 130 may be disposed at a center of the display panel 30 or the apparatus 1. But the embodiments of the present disclosure are not limited thereto. For example, the vibration apparatus 130 may be disposed at any position of the display member or the apparatus 1. For example, the center of the display member or the display panel 30 may be a folding region, a foldable region, or a flexible region. The folding region, the foldable region, or the flexible region may be formed in a second direction Y of the display panel 30. For example, the folding region, the foldable region, or the flexible region may be a center region of the display panel 30 or the apparatus 1 in the second direction Y of the display panel 30. As another example, a whole region of the display member or the display panel 30 may be the folding region, the foldable region, or the flexible region, and the vibration apparatus 130 may be disposed in a whole region of the display area. The apparatus 1 according to an embodiment of the present disclosure may be a foldable apparatus or a flexible apparatus. Hereinafter, an example where the apparatus 1 is the foldable apparatus will be described.

According to an embodiment of the present disclosure, the vibration apparatus 130 may be a film type vibration apparatus. The vibration apparatus 130 will be described below with reference to FIGS. 4 to 5F.

The vibration apparatus 130 may include a piezoelectric material. The vibration apparatus 130 may include a ceramic material. For example, the vibration apparatus 130 may include lead zirconate titanate (PZT), lead magnesium niobate-lead titanate (PMN-PT), lead zirconate niobite-lead titanate (PZN-PT), microfiber composites (MFC), $BaTiO_3$, $PbTiO_3$, Na—K—Nb (NKN), and polyvinylidene fluoride (PVDF), but embodiments of the present disclosure are not limited thereto.

At least one or more supporting members may be provided between the display member and the vibration apparatus 130. For example, the at least one or more supporting members may be disposed between the display panel 30 and the vibration apparatus 130. The at least one or more supporting members may include a first supporting member 10 and a second supporting member 20.

The first supporting member 10 may be disposed under the display member. For example, the first supporting member 10 may be disposed under the display panel 30. For example, the first supporting member 10 may be disposed between a rear surface of the display member (or the display panel 30) and the vibration apparatus 130. For example, the first supporting member 10 may be disposed between the display member (or the display panel 30) and the second supporting member 20. The first supporting member 10 may support the display member (or the display panel 30). For example, the first supporting member 20 may support the display member (or the display panel 30) along with the second supporting member 20. When the display member (or the display panel 30) is a foldable display member, the first supporting member 10 may maintain a constant curvature of the display member (or the display panel 30) when the foldable display member is folded in multi-folding and may prevent the occurrence of creases of a top surface (or an upper surface) of the display panel 30. For example, the first supporting member 10 may be a supporting substrate or plate, but the terms are not limited thereto.

The second supporting member 20 may be disposed under the display member (or the display panel 30). For example, the second supporting member 20 may be disposed between the vibration apparatus 130 and the first supporting member 10. The second supporting member 20 may support the first supporting member 10. For example, the second supporting member 20 may additionally support the first supporting member 10 so that a flexible substrate configuring the display panel 30 does not sag and may protect elements disposed on the flexible substrate from external moisture, heat, and impact.

For example, the second supporting member 20 may include stainless steel (SUS), including other metals such as nickel (Ni), or a metal material such as iron (Fe), aluminum (Al), or magnesium (Mg), but embodiments of the present disclosure are not limited thereto. For example, when the second supporting member 20 includes stainless steel (SUS), the stainless steel (SUS) may have a high restoring force and high stiffness, and thus, may maintain high stiffness even when a thickness of the second supporting member 20 is reduced. Therefore, the second supporting member 20 may support the display panel 30 and may decrease a total thickness of the apparatus 1, and thus, may reduce a curvature radius of a folding region. For example, the second supporting member 20 is not limited thereto and the second supporting member 20 may include a polymer such as polymethylmetacrylicate (PMMA), polycarbonate (PC), polyvinylalcohol (PVA), acrylonitrile-butadiene-styrene (ABS), polyethylene terephthalate (PET), silicone, or polyurethane (PU). For example, the second supporting member 20 may be a supporting substrate or plate, but the terms are not limited thereto.

According to an embodiment of the present disclosure, an adhesive 12 may be further provided between the vibration apparatus 130 and the second supporting member 20. The adhesive 12 may be connect or attach the vibration apparatus 130 to or on the second supporting member 20. For example, the adhesive 12 may include a pressure sensitive adhesive (PSA), a double-sided tape, or a double-sided foam pad, but embodiments of the present disclosure are not limited thereto.

According to an embodiment of the present disclosure, the apparatus 1 or the display member may further include a polarization member 40 on the display panel 30. The polarization member 40 may polarize light, emitted from the display panel 30, at a polarization angle. The polarization member 40 may discharge light, polarized at the polarization angle, to the outside. The polarization member 40 may have a function of preventing the reflection of light, except the light polarized at the polarization angle, of external light. For example, the polarization member 40 may transmit only light in a specific polarization direction, of the external light incident from the outside and may absorb the other light, and light passing through the polarization member 40 may be reflected by the display panel 30 and may be incident on the polarization member 40 again. At this time, a polarization direction of the reflected external light may be changed, and thus, the light which is incident on the polarization member 40 again may be absorbed by the polarization member 40 and may not be output to the outside, thereby preventing the reflection of the external light. Accordingly, the polarization member 40 may prevent the reflection of light input from the outside to secure the visibility of the display panel 30.

For example, the polarization member 40 may use a circular polarizer. When the polarization member 40 is the circular polarizer, the polarization member 40 may include a phase difference film disposed on one surface of the polarization member 40. For example, a λ/4 phase retardation film may be further provided between the polarization member 40 and the display panel 30.

The polarization member 40 may include a polymer film including, as a main component, polyvinyl alcohol (PVA)-based resin including iodine or dichroic dye and a protection film disposed on both sides of the polymer film. Iodine or dichroic dye may elongate to one axis and may be aligned in one direction. Also, the polarization member 40 may include a material other than polyvinyl alcohol-based resin. For example, the polarization member 40 may use an O-type polarization element where a liquid crystal composition including a dichroic material and a liquid crystal compound is aligned in a certain direction and an E-type polarizing material where a lyotropic liquid crystal is aligned in a certain direction.

The protection film of the polarization member 40 may include a transparent film without a phase retardation and may protect a polymer film from external water or pollution. The protection film may include triacetyl cellulose (TAC), polyethylene terephthalate (PET), cycloolefin polymer (COP), or a combination thereof, but embodiments of the present disclosure are not limited thereto.

According to an embodiment of the present disclosure, the apparatus 1 may further include a front member 60 at a front surface of the display panel 30. For example, the front member 60 may be on the display member. The front member 60 may transfer an image, displayed by the display member, to the outside and may protect the display member. For example, the front member 60 may protect the display member from an external impact or stress and may prevent the occurrence of damage. The front member 60 may be implemented with a ductile plastic-based cover (or overlay) capable of being folded for the thinness and flexibility of the apparatus 1. For example, the front member 60 may be a cover window or a window cover, but the terms are not limited thereto. A center of the display member 30 or the apparatus 1 may be a foldable region and may be bent in a curved shape based on the foldable region. For example, each of the front member 60, the display member, and the vibration apparatus 130 may be bent in a curved shape.

For example, a protection film may be further provided on the front member 60. The front member 60 may be formed to have a thin thickness of tens μm, and due to this, may be damaged by an external small impact or continuous folding. The protection film may protect the front member 60 from a compression stress and a tensile stress based on an external impact or continuous folding. Also, when glass powders occur because the front member 60 is damaged by an external impact or a stress, the protection film may prevent the glass powders from being scattered. For example, the protection film may include a film such as polyethylene terephthalate, but embodiments of the present disclosure are not limited thereto. For example, the protection film may include triacetylcellulose, cycloolefin polymer (COP), or a combination material thereof.

According to another embodiment of the present disclosure, a touch panel configuring a touch sensor may be further provided between the display member and the front member 60. For example, the touch panel may include a touch electrode layer which is provided on the display panel 30 and includes a touch electrode for sensing a user touch applied to the display panel 30. The touch electrode layer may sense a capacitance variation of the touch electrode based on the user touch. For example, a mutual-capacitance type where a plurality of touch driving electrodes and a plurality of touch sensing electrodes are configured to intersect or a self-capacitance type where only a plurality of touch sensing electrodes are arranged may be applied, and an adhesive layer may be disposed on a top surface or a bottom surface and may be attached on and fixed to an upper element or a lower element.

The apparatus 1 according to an embodiment of the present disclosure may include at least one or more adhesive members. The elements, for example, the first and second supporting members 10 and 20, the display panel 30, the polarization member 40, and/or the front member 60, may be attached or connected to each another by an adhesive member. The vibration apparatus 130 according to an embodiment of the present disclosure may be disposed under the display panel 30, and thus, may be difficult to output a sound S to a forward region with respect to the display panel 30. For example, the inventors have recognized that it is unable to implement a desired sound because various elements and/or the adhesive member are/is on the display panel 30. In addition, the separate vibration apparatus 130 may be disposed under an element (for example, the display panel 30) so that a vibration of the vibration apparatus 130 is transferred to the front member 60, but the inventors have recognized that a process is difficult. Also, the inventors have recognized that the loss of a vibration of the vibration apparatus 130 occurs due to the adhesive member. Therefore, the adhesive member may be configured as an adhesive member having a high modulus, but may adversely affect the reliability of the apparatus 1 (for example, a foldable apparatus). Accordingly, through various experiments, the inventors have implemented the apparatus 1 which does not affect the display performance and/or reliability of the apparatus 1 and prevents the loss of a vibration of the vibration apparatus 130 by improving the adhesive member. According to an embodiment of the present disclosure, the apparatus 1 may be configured so that a vibration transfer member is further included in the adhesive member, in order to transfer a vibration of the vibration apparatus 130 to the display member and/or the front member 60, and thus, a vibration of the vibration apparatus 130 may be transferred to the front member 60 without being lost.

According to an embodiment of the present disclosure, the apparatus 1 may include an adhesive member 94 between the display member and the front member 60. For example, the adhesive member 94 may be disposed or interposed between the display panel 30 and the front member 60. For example, the adhesive member 94 may be a fourth adhesive member or a vibration transfer member, but the terms are not limited thereto. For example, the fourth adhesive member 94 may be disposed between the polarization member 40 and the front member 60.

According to an embodiment of the present disclosure, the apparatus 1 may further include a first adhesive member 91 between the first supporting member 10 and the second supporting member 20. The apparatus 1 may further include the first adhesive member 91 between the first supporting member 10 and the second supporting member 20. The apparatus 1 may further include a second adhesive member 92 between the first supporting member 10 and the display panel 30. The apparatus 1 may further include a third adhesive member 93 between the display panel 30 and the polarization member 40.

At least one of the first to fourth adhesive members 91 to 94 may be configured with an optically transparent adhesive member. For example, the optically transparent adhesive member may be an optically clear adhesive (OCA) and an optically clear resin (OCR), but embodiments of the present disclosure are not limited thereto. For example, at least one of the first to fourth adhesive members 91 to 94 may include an acrylic material, a silicone-based material, and a urethane-based material, but embodiments of the present disclosure are not limited thereto.

According to an embodiment of the present disclosure, one or more of the first adhesive member 91 and the second adhesive member 92 may include a vibration transfer member. One or more of the third adhesive member 93 and the fourth adhesive member 94 may include a vibration transfer member. One or more of the first to fourth adhesive members 91 to 94 may include a vibration transfer member. At least one or more of the first to fourth adhesive members 91 to 94 may be a vibration transfer member, but the terms are not limited thereto.

According to an embodiment of the present disclosure, one or more of the first to fourth adhesive members 91 to 94 may include an acrylic material, a silicone-based material, and a urethane-based material, but embodiments of the present disclosure are not limited thereto. One or more of the first to fourth adhesive members 91 to 94 may be configured as a film after the material of one or more of the first to fourth adhesive members 91 to 94 is mixed with a piezoelectric material and cured, and thus, one or more of the first to fourth adhesive members 91 to 94 including a piezoelectric material may be formed. Therefore, one or more of the first to fourth adhesive members 91 to 94 may be implemented as a film type including a piezoelectric material, and thus, may be easily formed as a film (for example, a bonding type (or laminating type) with PET (polyethylene terephthalate) and/or PI (polyimide, etc.)) included in another element. According to another embodiment of the present disclosure, the piezoelectric material of one or more of the first to fourth adhesive members 91 to 94 may be formed to be identical to the piezoelectric material of the vibration apparatus 130.

Figure 3:
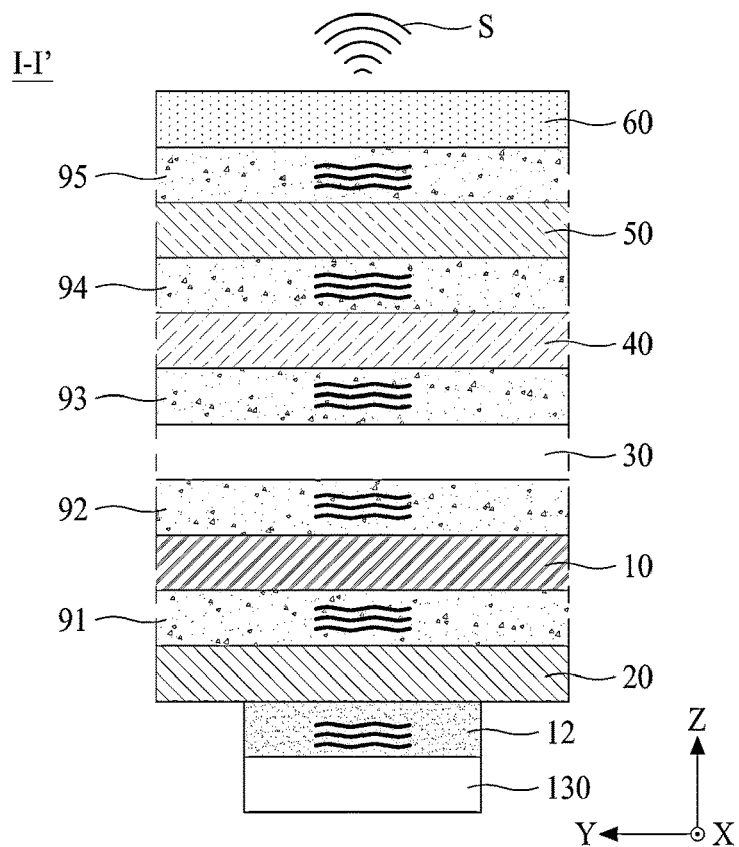
FIG. 3 is another cross-sectional view taken along line I-I' of FIG. 1.

FIG. 3 is another cross-sectional view taken along line I-I' of FIG. 1. In FIG. 3, the same elements as descriptions of FIG. 2 are referred to by like reference numerals, and repeated descriptions thereof are omitted or will be briefly given below.

Referring to FIG. 3, the apparatus 1 may further include a first layer 50 between the display member (or the display panel 130) and the front member 60. For example, the first layer 50 may be disposed between a front surface of the display panel 30 and the front member 60. For example, the first layer 50 may be disposed between the polarization member 40 and the front member 60.

The first layer 50 may be a layer including a pattern which is formed to be seen by a user even when the display panel 30 does not display an image. For example, the first layer 50 may include an organic material or an inorganic material. For example, the organic material may be a black ink or carbon black, but embodiments of the present disclosure are not limited thereto. For example, the inorganic material may include silicon oxide (SiOx), silicon nitride (SiNx), and metal, but embodiments of the present disclosure are not limited thereto. For example, the non-display area of the display panel 30 may be expressed in substantially the same color as that of the display area of the display panel 30 even when the display panel 30 does not display an image, and thus, the first layer 50 may enable a user to see a wide screen of the display member. The first layer 50 may be a decorative layer, but the terms are not limited thereto.

The apparatus 1 according to an embodiment of the present disclosure may further include a fifth adhesive member 95 between the first layer 50 and the front member 60. For example, the fourth adhesive member 94 may be disposed between the polarization member 40 and the first layer 50.

The fifth adhesive member 95 may be configured to be identical to one or more of the first to fourth adhesive members 91 to 94. One or more of the first to fifth adhesive members 91 to 95 may include an acrylic material, a silicone-based material, and a urethane-based material, but embodiments of the present disclosure are not limited thereto. One or more of the first to fifth adhesive members 91 to 95 may be configured as a film after the material of one or more of the first to fourth adhesive members 91 to 94 is mixed with a piezoelectric material and cured, and thus, one or more of the first to fifth adhesive members 91 to 95 including a piezoelectric material may be formed. Therefore, one or more of the first to fourth adhesive members 91 to 94 may be implemented as a film type including a piezoelectric material, and thus, may be easily formed as a film (for example, a bonding type (or laminating type) to PET and/or PI, etc.) included in another element. According to another embodiment of the present disclosure, the piezoelectric material of one or more of the first to fifth adhesive members 91 to 95 may be formed to be identical to the piezoelectric material of the vibration apparatus 130. At least one or more of the first to fifth adhesive members 91 to 95 may be a vibration transfer member, but the terms are not limited thereto.

According to an embodiment of the present disclosure, at least one or more of the first adhesive member 91 and the second adhesive member 92 may include a vibration transfer member. At least one or more of the third adhesive member 93 and the fourth adhesive member 94 may include a vibration transfer member. At least one or more of the third to fifth adhesive members 93 to 95 may include a vibration transfer member. At least one or more of the first to fifth adhesive members 91 to 95 may include a vibration transfer member.

When an alternating current (AC) voltage is applied, the vibration apparatus 130 according to an embodiment of the present disclosure may vibrate as contraction and expansion are alternately repeated based on a piezoelectric effect and/or an inverse piezoelectric effect, and thus, may vibrate the display panel 30 through the vibration. For example, the vibration apparatus 130 may vibrate based on a voice signal synchronized with an image displayed by the display panel 30 to vibrate the display panel 30. According to another embodiment of the present disclosure, the vibration apparatus 130 may vibrate based on a haptic feedback signal (or a tactile feedback signal) synchronized with a user touch applied to the touch panel (or the touch sensor layer) which is disposed on the display panel 30 or embedded in the display panel 30, and thus, may vibrate the display panel 30 and/or the front member 60. Accordingly, the display panel 30 and/or the front member 60 may vibrate based on a vibration of the vibration apparatus 130 to provide a user (or a viewer) with one or more of a sound and a haptic feedback.

Therefore, the apparatus 1 according to an embodiment of the present disclosure may output a sound, generated by a vibration of the vibration apparatus 130, in a forward direction of the display panel 30 and/or the front member 60.

According to an embodiment of the present disclosure, a vibration transfer member included in an adhesive member may include a metal nano particle or a piezoelectric material. When the adhesive member includes an acrylic material and includes the metal nano particle or the piezoelectric material, a result obtained by measuring physical properties may be show in the following Table 1.

The metal nano particle in the following Table 1 may be nickel (Ni), but embodiments of the present disclosure are not limited thereto. The piezoelectric material may be $BaTiO_3$, but embodiments of the present disclosure are not limited thereto.

TABLE 1

| Division | | Experiment Example | Embodiment 1 | Embodiment2 |
|---|---|---|---|---|
| Modulus | | $4 \times 10^4$ Pa | $2 \times 10^5$ Pa | $5 \times 10^4$ Pa |
| Optical Characteristic | T (%) | 92 | 77 | 91 |
| | Haze | 0.3 | 10 | 0.7 |

In Table 1, the experiment example is configured with an acrylic-based optically transparent adhesive, the embodiment 1 is configured with an acrylic-based optically transparent adhesive including the metal nano particle, and the embodiment 2 is configured with an acrylic-based optically transparent adhesive including the piezoelectric material. Measurement has been performed under a condition where a diameter of each of the metal nano particle and the piezoelectric material is 50 nm to 150 nm, a content of the metal nano particle and the piezoelectric material is added by 10 wt % in a total content of the acrylic-based optically transparent adhesive, and the metal nano particle and the piezoelectric material are stacked by 1 mm. Details of the experiment do not limit details of an embodiment of the present disclosure.

Referring to Table 1, a modulus has been measured by ARES-G2 equipment at a room temperature. Referring to Table 1, a modulus of the experiment example has been measured to be $4 \times 10^4$ Pa, and a modulus of the embodiment 1 has been measured to be $2 \times 10^5$ Pa. Also, a modulus of the embodiment 2 has been measured to be $5 \times 10^4$ Pa. Accordingly, the embodiment 1 has increased more than a modulus of the embodiment 2, and thus, may affect the reliability of a foldable apparatus.

The optical characteristic may include a transmittance (T) (%) and a haze (Haze). Referring to a transmittance, the experiment example has been measured to be 92%, the embodiment 1 has been measured to be 77%, and the embodiment 2 has been measured to be 91%. For example, because nickel (Ni) which is the metal nano particle of the embodiment 1 has a color close to black, it may be seen that a transmittance is reduced. When a transmittance (T) (%) is greater than 90% in a wavelength of 600 nm, this may be a range which does not affect the reliability of the apparatus, but embodiments of the present disclosure are not limited thereto.

A haze may be a ratio of scattered light to incident light. Referring to a haze, the experiment example has been measured to be 0.3, the embodiment 1 has been measured to be 10, and the embodiment 2 has been measured to be 0.7. For example, a haze of the embodiment 2 may slightly increase compared to the experiment example and may be a range which does not affect the reliability of the apparatus. When a haze is 1.0, this may be a range which does not affect the reliability of the apparatus, but embodiments of the present disclosure are not limited thereto.

According to an embodiment of the present disclosure, when a vibration transfer member included in an adhesive member includes a piezoelectric material, it may be seen that a modulus and an optical characteristic of the vibration transfer member do not affect the display performance and/or reliability of the apparatus 1.

The following Table 2 shows a result obtained by measuring a sound pressure level and a folding characteristic under a condition where the first to fifth adhesive members 91 to 95 of FIG. 3 are configured. In the following Table 2, an experiment example is configured with an acrylic-based optically transparent adhesive, an embodiment 1 is configured with an acrylic-based optically transparent adhesive including a metal nano particle, and an embodiment 2 is configured with an acrylic-based optically transparent adhesive including a piezoelectric material. Measurement has been performed under a condition where a diameter of each of the metal nano particle and the piezoelectric material is 50 nm to 150 nm, a content of the metal nano particle and the piezoelectric material is added by 10 wt % in a total content of the acrylic-based optically transparent adhesive, and the metal nano particle and the piezoelectric material are stacked by 1 mm. The acrylic-based optically transparent adhesive includes a material having a modulus of $4 \times 10^4$ Pa, and a thickness thereof is 25 μm. Details of the experiment do not limit details of an embodiment of the present disclosure.

TABLE 2

| Division | | Experiment Example | Embodiment 1 | Embodiment2 |
|---|---|---|---|---|
| Sound pressure level Enhancement ratio (%) | | 0% | −10% | 10% |
| Folding Evaluation | Room Temperature | OK | NG | OK |
| | High temperature and High Humidity | OK | NG | OK |

Referring to Table 2, when a sound pressure level of the experiment example is 100% in a frequency of 0.2 kHz to 10 kHz, the embodiment 1 has been measured to be 90%, and the embodiment 2 has been measured to be 110%. It may be seen that the embodiment 1 decreases more in sound pressure level than the experiment example and the embodiment 2 increases more in sound pressure level than the experiment example. In the embodiment 1, it may be seen that loss of a sound wave caused by reflection and/or refraction by particles occurs, and due to this, a sound pressure level decreases. In the embodiment 2, it may be seen that a sound wave is reinforced by a piezoelectric material, and thus, a sound pressure level increases.

In Table 2, in a folding characteristic, a folding curvature has been measured to be 2.5 R, and a folding speed has been measured to be one time per 2 seconds. In the high temperature and high humidity, a temperature may be 50° C., and humidity may be 80%. Also, the folding characteristic has been measured by performing folding 100 times. Details of the experiment do not limit details of an embodiment of the present disclosure.

Referring to Table 2, a result has been obtained where the experiment example and the embodiment 2 are OK in 100-time folding and the embodiment 1 is NG in 100-time folding. In the embodiment 1, it may be seen that a crack of an upper portion of a display member (for example, a display panel) occurs.

According to an embodiment of the present disclosure, it may be seen that a sound pressure level characteristic and a folding characteristic are not affected despite a case where a vibration transfer member is provided in one or more of the first to fifth adhesive members 91 to 95. For example, it may be seen that a sound pressure level characteristic and a folding characteristic are not affected despite a case where a piezoelectric material which is a vibration transfer member is provided in one or more of the first to fifth adhesive members 91 to 95.

A high stress may be applied to an adhesive member disposed above the display panel 30 in folding. Also, the adhesive member disposed above the display panel 30 should maintain an optical characteristic where the adhesive member is more transparent than an adhesive member disposed under the display panel 30. Therefore, a content of a vibration transfer member included in the adhesive member disposed under the display panel 30 may be adjusted to be different from that of a vibration transfer member included in the adhesive member disposed above the display panel 30. For example, a content of the vibration transfer member included in the adhesive member disposed under the display panel 30 may be adjusted to be more than that of the vibration transfer member included in the adhesive member disposed above the display panel 30. For example, a content of a vibration transfer member included in an adhesive member closer to the vibration apparatus 130 than closer to the display panel 30 may be adjusted to be different from that of a vibration transfer member included in an adhesive member closer to the display panel 30 than closer to the vibration apparatus 130. For example, a content of the vibration transfer member included in the adhesive member closer to the vibration apparatus 130 than the display panel 30 may be adjusted to be more than that of the vibration transfer member included in the adhesive member closer to the display panel 30 than the vibration apparatus 130. For example, a content of a vibration transfer member included in the first adhesive member 91 may be adjusted to be more than that of a vibration transfer member included in the second adhesive member 92. For example, a content of the vibration transfer member included in the first adhesive member 91 and/or the second adhesive member 92 may be adjusted to be more than that of a vibration transfer member included in the third adhesive member 93. For example, a content of the vibration transfer member included in the first adhesive member 91 and/or the second adhesive member 92 may be adjusted to be more than that of a vibration transfer member included in the fourth adhesive member 94. For example, a content of the vibration transfer member included in the first adhesive member 91 and/or the second adhesive member 92 may be adjusted to be more than that of a vibration transfer member included in the fifth adhesive member 95. For example, a content of the vibration transfer member included in the first adhesive member 91 and/or the second adhesive member 92 may be adjusted to be more than that of a vibration transfer member included in one or more of the third to fifth adhesive members 93 to 95. Accordingly, a vibration of the vibration apparatus 130 may be transferred to the display panel 30 and/or the front member 60 without being lost. Also, the display performance and/or reliability of the display panel 30 may not be reduced, and an adverse effect thereof on the polarization performance of the polarization member 40 disposed on the display panel 30 may be minimized.

According to an embodiment of the present disclosure, one or more of the first adhesive member 91 and the second adhesive member 92 may be configured so that a content of a vibration transfer member included therein is differently adjusted. For example, the first adhesive member 91 and the second adhesive member 92 may respectively include vibration transfer members having different contents. One or more of the third adhesive member 93 and the fourth adhesive member 94 may be configured so that a content of a vibration transfer member included therein is differently adjusted. For example, the third adhesive member 93 and the fourth adhesive member 94 may respectively include vibration transfer members having different contents. One or more of the third to fifth adhesive members 93 to 95 may be configured so that a content of a vibration transfer member included therein is differently adjusted. For example, the third to fifth adhesive members 93 to 95 may respectively include vibration transfer members having different contents.

According to an embodiment of the present disclosure, one or more of the first to fourth adhesive members 91 to 94 may be configured so that a content of a vibration transfer member included therein is differently adjusted. For example, the first to fourth adhesive members 91 to 94 may respectively include vibration transfer members having different contents. For example, a content of a vibration transfer member included in each of the first to fourth adhesive members 91 to 94 may decrease progressively toward the front member 60 from the vibration apparatus 130. One or more of the first to fifth adhesive members 91 to 95 may be configured so that a content of a vibration transfer member included therein is differently adjusted. For example, the first to fifth adhesive members 91 to 95 may respectively include vibration transfer members having different contents. For example, a content of the vibration transfer member included in each of the first to fifth adhesive members 91 to 95 may decrease progressively toward the front member 60 from the vibration apparatus 130.

For example, in a content of the first adhesive member 91, a content of the vibration transfer member may be 20 wt % with respect to an optically transparent adhesive member of the first adhesive member 91. In a content of the second adhesive member 92, a content of the vibration transfer member may be 15 wt % with respect to an optically transparent adhesive member of the second adhesive member 92. In a content of the third adhesive member 93, a content of the vibration transfer member may be 10 wt % with respect to an optically transparent adhesive member of the third adhesive member 93. In a content of the fourth adhesive member 94, a content of the vibration transfer member may be 6 wt % with respect to an optically transparent adhesive member of the fourth adhesive member 94. In a content of the fifth adhesive member 95, a content of the vibration transfer member may be 2 wt % with respect to an optically transparent adhesive member of the fifth adhesive member 95.

According to an embodiment of the present disclosure, a vibration characteristic of the vibration apparatus 130 may be more enhanced by adjusting a content of the vibration transfer member included in one or more of the first to fifth adhesive members 91 to 95, thereby providing an apparatus for enhancing a sound characteristic and/or a sound pressure level characteristic and minimizing an adverse effect on a folding characteristic.

TABLE 3

| Division | First adhesive member | Second adhesive member | Third adhesive member | Fourth adhesive member | Fifth adhesive member |
|---|---|---|---|---|---|
| Particle (%) | 80~50 | 80~50 | 90 | 95 | 100 |
| Wire (%) | 20~50 | 20~50 | 10 | 5 | 0 |
| Total (%) | 100 | 100 | 100 | 100 | 100 |

In Table 3, the first to fifth adhesive members 91 to 95 of FIG. 3 are configured, and a thickness of each of the first to fifth adhesive members 91 to 95 is set to 25 μm. The thickness does not limit details of the present disclosure.

The vibration transfer member may include a particle shape and a wire shape, but embodiments of the present disclosure are not limited thereto. A content of the particle shape and/or the wire shape may be differently adjusted in one or more of the first to fifth adhesive members 91 to 95. A particle may be circular, but embodiments of the present disclosure are not limited thereto. When the same volume and the same content are adjusted, a wire having a length or a volume which is longer or greater than that of the particle may be more effective in vibration transfer, and a content of the particle and/or the wire may be adjusted based on a folding characteristic and/or the reliability of an apparatus.

Referring to Table 3, with respect to an optically transparent adhesive member of the first adhesive member 91, a content of a particle of the first adhesive member 91 may be 50% to 80%, and a content of a wire shape may be 20% to 50%. With respect to an optically transparent adhesive member of the second adhesive member 92, a content of a particle of the second adhesive member 92 may be 50% to 80%, and a content of a wire shape may be 20% to 50%. With respect to an optically transparent adhesive member of the third adhesive member 93, a content of a particle of the third adhesive member 93 may be 90%, and a content of a wire shape may be 10%. With respect to an optically transparent adhesive member of the fourth adhesive member 94, a content of a particle of the fourth adhesive member 94 may be 95%, and a content of a wire shape may be 5%. With respect to an optically transparent adhesive member of the fifth adhesive member 95, a content of a particle of the fifth adhesive member 95 may be 100%, and a content of a wire shape may be 0%.

According to an embodiment of the present disclosure, a content of a wire of a vibration transfer member included in an adhesive member closer to the vibration apparatus 130 than closer to the display panel 30 may be adjusted to be more than that of a wire of a vibration transfer member included in an adhesive member closer to the display panel 30 than closer to the vibration apparatus 130. For example, a content of a wire included in the first adhesive member 91 and a content of a wire included in the second adhesive member 92 may be identically adjusted. As another example, a content of a wire included in the first adhesive member 91 may be adjusted to be more than that of a wire included in the second adhesive member 92. For example, a content of a wire included in the first adhesive member 91 and/or the second adhesive member 92 may be adjusted to be more than that of a wire included in the third adhesive member 93. For example, a content of a wire included in the first adhesive member 91 and/or the second adhesive member 92 may be adjusted to be more than that of a wire included in the fourth adhesive member 94. For example, a content of a wire included in the first adhesive member 91 and/or the second adhesive member 92 may be adjusted to be more than that of a wire included in the fifth adhesive member 95. For example, a content of a wire included in the first adhesive member 91 and/or the second adhesive member 92 may be adjusted to be more than that of a wire included in one or more of the third to fifth adhesive members 93 to 95. Therefore, a vibration of the vibration apparatus 130 may be transferred to the display panel 30 and/or the front member 60 without being lost. Also, the display performance and/or reliability of the display panel 30 may not be reduced, and an adverse effect on the polarization performance of the polarization member 40 disposed on the display panel 30 may be minimized. Also, a vibration characteristic of the vibration apparatus 130 may be more enhanced by adjusting a content of a wire included in one or more of the first to fifth adhesive members 91 to 95, thereby providing an apparatus having enhanced sound characteristic and/or sound pressure level characteristic. Also, a vibration characteristic of the vibration apparatus 130 may be more enhanced by adjusting a content of a particle and/or a wire of a vibration transfer member included in one or more of the first to fifth adhesive members 91 to 95, thereby providing an apparatus having enhanced sound characteristic and/or sound pressure level characteristic.

According to an embodiment of the present disclosure, a content of a vibration transfer member included in one or more of the first to fifth adhesive members 91 to 95 may be differently adjusted, thereby minimizing an adverse effect on an optical characteristic of the apparatus 10. Also, a content of different shapes of a vibration transfer member included in one or more of the first to fifth adhesive members 91 to 95 may be differently adjusted, thereby enhancing a sound characteristic and/or a sound pressure level characteristic and minimizing an adverse effect on a folding characteristic.

According to an embodiment of the present disclosure, because a vibration transfer member is provided in one or more of the first to fifth adhesive members 91 to 95, an apparatus which has an enhanced sound pressure level and does not affect a folding characteristic may be provided. For example, when a piezoelectric material is included as a vibration transfer member in one or more of the first to fifth adhesive members 91 to 95, an apparatus which has an enhanced sound pressure level and does not affect a folding characteristic may be provided. For example, when a piezoelectric material is included as a vibration transfer member in one or more of the first to fifth adhesive members 91 to 95, an apparatus which has an enhanced sound pressure level and does not affect a folding characteristic may be provided compared to a metal nano particle.

According to an embodiment of the present disclosure, because a vibration transfer member is provided in one or more of the first to fifth adhesive members 91 to 95 and is adjusted to have different contents based on contents of different vibration transfer members and/or shapes of different vibration transfer members, and thus, a vibration of the vibration apparatus 130 may be transferred to the display panel 30 and/or the front member 60 without being lost. Also, the display performance and/or reliability of the display panel 30 may not be reduced, and an adverse effect thereof on the polarization performance of the polarization member 40 disposed on the display panel 30 may be minimized.

Figure 4:
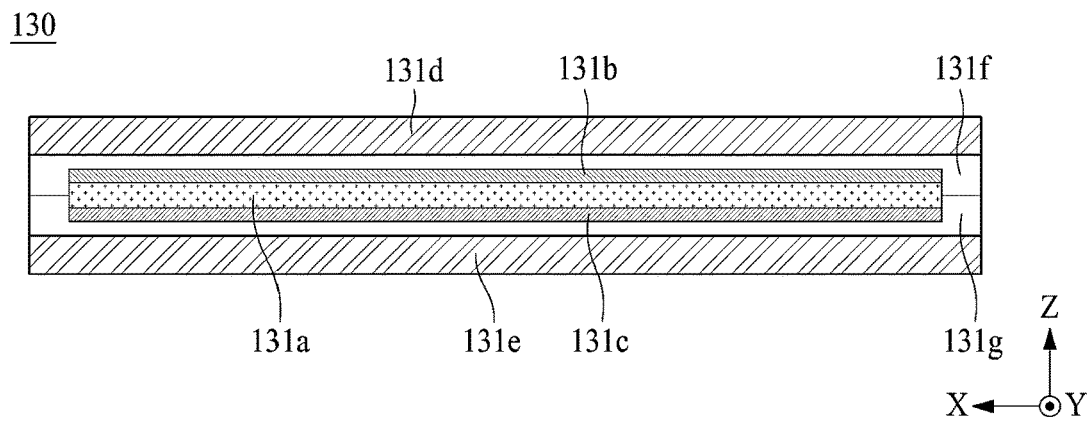
FIG. 4 illustrates a vibration apparatus according to an embodiment of the present disclosure.

FIG. 4 illustrates a vibration apparatus according to an embodiment of the present disclosure. FIGS. 5A to 5F illustrate a vibration portion of a vibration apparatus according to an embodiment of the present disclosure.

The vibration apparatus 130 according to an embodiment of the present disclosure may be referred to as a flexible vibration structure, a flexible vibrator, a flexible vibration generating device, a flexible vibration generator, a flexible sounder, a flexible sound device, a flexible sound generating device, a flexible sound generator, a flexible actuator, a flexible speaker, a flexible piezoelectric speaker, a film actuator, a film type piezoelectric composite actuator, a film speaker, a film piezoelectric speaker, or a film type piezoelectric composite speaker, but the terms are not limited thereto.

Referring to FIG. 4, the vibration apparatus 130 may include a vibration portion 131a, a first electrode portion 131b, and a second electrode portion 131c.

The vibration portion 131a according to an embodiment of the present disclosure may include a piezoelectric material. For example, the vibration portion 131a may include one or more of a piezoelectric inorganic material and a piezoelectric organic material.

For example, the vibration portion 131a may include a piezoelectric material (or an electro active material) having a piezoelectric effect. For example, the piezoelectric material may have a characteristic where pressure or twisting is applied to a crystalline structure by an external force, a potential difference occurs due to dielectric polarization caused by a relative position change of a positive (+) ion and a negative (−) ion, and a vibration is generated by an electric field based on a voltage applied thereto. The vibration portion 131a may be referred to as the terms such as a vibration layer, a piezoelectric layer, a piezoelectric material layer, an electro active layer, a vibration portion, a piezoelectric material portion, an electro active portion, a piezoelectric structure, a piezoelectric composite layer, a piezo-electric composite, or a piezoelectric ceramic composite, but the terms are not limited thereto. The vibration portion 131a may include a transparent conductive material, a semitransparent conductive material, or an opaque conductive material and may be transparent, semitransparent, or opaque.

The vibration apparatus 130 or the vibration portion 131a according to an embodiment of the present disclosure may include a ceramic-based material for implementing a relatively high vibration, or may include a piezoelectric ceramic having a perovskite-based crystalline structure. The perovskite crystalline structure may have a piezoelectric effect and an inverse piezoelectric effect, and may be a plate-shaped structure having orientation. The perovskite crystalline structure may be represented by a chemical formula "$ABO_3$". In the chemical formula, "A" may include a divalent metal element, and "B" may include a tetravalent metal element. For example, in the chemical formula "$ABO_3$", "A" and "B" may be cations, and "0" may be anions. For example, the vibration portion 131a may include one or more of lead(II) titanate ($PbTiO_3$), lead zirconate ($PbZrO_3$), lead zirconate titanate ($PbZrTiO_3$), barium titanate ($BaTiO_3$), and strontium titanate ($SrTiO_3$), but embodiments of the present disclosure are not limited thereto.

According to an embodiment of the present disclosure, the vibration apparatus 130 or the vibration portion 131a may include a lead zirconate titanate (PZT)-based material including lead (Pb), zirconium (Zr), and titanium (Ti) or may include a lead zirconate nickel niobate (PZNN)-based material including lead (Pb), zinc (Zn), nickel (Ni), and niobium (Nb), but embodiments of the present disclosure are not limited thereto. In another embodiment, the vibration apparatus 130 or the vibration portion 131a may include at least one of $CaTiO_3$, $BaTiO_3$, and $SrTiO_3$ without Pb, but embodiments of the present disclosure are not limited thereto.

The first electrode portion 131b may be disposed at a first surface (or an upper surface) of the vibration portion 131a and may be electrically connected to the first surface of the vibration portion 131a. The second electrode portion 131c may be disposed at a surface which differs from the first surface of the vibration portion 131a. For example, the second electrode portion 131c may be disposed at a second surface (or a lower surface) of the vibration portion 131a and may be electrically connected to the second surface of the vibration portion 131a. For example, the vibration portion 131a may be polarized (or poling) by a certain voltage applied to the first electrode portion 131b and the second electrode portion 131c in a certain temperature atmosphere or a temperature atmosphere which is changed from a high temperature to a room temperature.

For example, the first electrode portion 131b may have a single electrode form where the first electrode portion 131b is disposed at the whole first surface of the vibration portion 131a. The first electrode portion 131b according to an embodiment of the present disclosure may include a transparent conductive material, a semitransparent conductive material, or an opaque conductive material. For example, the transparent conductive material or the semitransparent conductive material may include indium tin oxide (ITO) or indium zinc oxide (IZO), but embodiments of the present disclosure are not limited thereto. The opaque conductive material may include aluminum (Al), copper (Cu), gold (Au), molybdenum (Mo), magnesium (Mg), or an alloy thereof, but embodiments of the present disclosure are not limited thereto.

The second electrode portion 131c may be disposed on the second surface (or a rear or backside surface), which is opposite to or different from the first surface, of the vibration portion 131a and may be electrically connected to the second surface of the vibration portion 131a. For example, the second electrode portion 131c may have a single electrode form where the second electrode portion 131c is disposed at the whole second surface of the vibration portion 131a. The second electrode portion 131c according to an embodiment of the present disclosure may include a transparent conductive material, a semitransparent conductive material, or an opaque conductive material. For example, the second electrode portion 131c may include the same material as that of the first electrode portion 131b, but embodiments of the present disclosure are not limited thereto. In another embodiment of the present disclosure, the second electrode portion 131c may include a material which differs from that of the first electrode portion 131b.

The vibration apparatus 130 according to an embodiment of the present disclosure may further include a first cover (or overlay) member 131d and a second cover (or overlay) member 131e.

The first cover member 131d may be disposed on a first surface of the vibration portion 131a. For example, the first cover member 131d may be provided at the first electrode portion 131b. For example, the first cover member 131d may be provided on the first electrode portion 131b. For example, the first cover member 131d may cover (or overlay) the first electrode portion 131b disposed at the first surface of the vibration portion 131a, and thus, may protect the first surface of the vibration portion 131a or the first electrode portion 131b.

The second cover member 131e may be disposed at a second surface of the vibration portion 131a. For example, the second cover member 131e may be provided at the second electrode portion 131c. For example, the second cover member 131e may be provided under the second electrode portion 131c. For example, the second cover member 131e may cover (or overlay) the second electrode portion 131c disposed at the second surface of the vibration portion 131a, and thus, may protect the second surface of the vibration portion 131a or the second electrode portion 131c.

Each of the first cover member 131d and the second cover member 131e according to an embodiment of the present disclosure may include one or more materials of plastic, fiber, and wood, but embodiments of the present disclosure are not limited thereto. For example, each of the first cover member 131d and the second cover member 131e may include the same material or different materials. For example, each of the first cover member 131d and the second cover member 131e may be a polyimide film or a polyethylene terephthalate film, but embodiments of the present disclosure are not limited thereto.

The vibration apparatus 130 according to an embodiment of the present disclosure may further include a first adhesive layer 131f and a second adhesive layer 131g. For example, the first adhesive layer 131f may be disposed between the first cover member 131d and the first electrode portion 131b. For example, the second adhesive layer 131g may be disposed between the second cover member 131e and the second electrode portion 131c.

The first cover member 131d according to an embodiment of the present disclosure may be at the first electrode portion 131b. For example, the first cover member 131d may be disposed at the first surface of the vibration portion 131a by using the first adhesive layer 131f. For example, the first cover member 131d may be connected or coupled to the first electrode portion 131b by the first adhesive layer 131f. For example, the first cover member 131d may be disposed at the first surface of the vibration portion 131a by a film laminating process using the first adhesive layer 131f. Accordingly, the vibration portion 131a may be integrated (or disposed) into the first cover member 131d.

The second cover member 131e according to an embodiment of the present disclosure may be at the second electrode portion 131c. For example, the second cover member 131e may be disposed at the second surface of the vibration portion 131a by the second adhesive layer 131g. For example, the second cover member 131e may be connected or coupled to the second electrode portion 131c by using the second adhesive layer 131g. For example, the second cover member 131e may be disposed at a second surface of the vibration portion 131a by a film laminating process using the second adhesive layer 131g. Accordingly, the vibration portion 131a may be integrated (or disposed) into the second cover member 131e.

For example, the first adhesive layer 131f and the second adhesive layer 131g may fully surround the vibration portion 131a. For example, the first adhesive layer 131f and the second adhesive layer 131g may be disposed between the first cover member 131d and the second cover member 131e to surround the vibration portion 131a, the first electrode portion 131b, and the second electrode portion 131c. For example, the first adhesive layer 131f and the second adhesive layer 131g may be disposed between the first cover member 131d and the second cover member 131e to fully surround the vibration portion 131a, the first electrode portion 131b, and the second electrode portion 131c. For example, the vibration portion 131a, the first electrode portion 131b, and the second electrode portion 131c may be buried or embedded between the first adhesive layer 131f and the second adhesive layer 131g. For convenience of description, the first adhesive layer 131f and the second adhesive layer 131g are illustrated, but are not limited thereto and may be provided as one adhesive layer.

Each of the first adhesive layer 131f and the second adhesive layer 131g according to an embodiment of the present disclosure may include an electrical insulation material which has adhesive properties and is capable of compression and decompression. For example, each of the first adhesive layer 131f and the second adhesive layer 131g may include epoxy resin, acryl resin, silicone resin, or urethane resin, but embodiments of the present disclosure are not limited thereto.

The vibration apparatus 130 according to an embodiment of the present disclosure may further include a signal cable.

The signal cable may be electrically connected to the pad portion disposed in the vibration apparatus 130 and may supply the vibration apparatus 130 with a vibration driving signal (or a sound signal) provided from a sound processing circuit. The signal cable according to an embodiment of the present disclosure may include a terminal, and the terminal may be electrically connected to a pad electrode of the pad portion. For example, the signal cable may be configured as a flexible cable, a flexible printed circuit cable, a flexible flat cable, a single-sided flexible printed circuit, a single-sided flexible printed circuit board (PCB), a flexible multi-layer printed circuit, or a flexible multi-layer PCB, but embodiments of the present disclosure are not limited thereto. For example, the signal cable may be configured to be transparent, semitransparent, or opaque.

The sound processing circuit may generate an alternating current (AC) vibration driving signal including a first vibration driving signal and a second vibration driving signal based on sound source. The first vibration driving signal may be one of a positive (+) vibration driving signal and a negative (−) vibration driving signal, and the second vibration driving signal may be one of the positive (+) vibration driving signal and the negative (−) vibration driving signal. For example, the first vibration driving signal may be supplied to the first electrode portion 131b of the vibration apparatus 130 through the terminal of the signal cable, the pad electrode of the pad portion, and a first power supply line. The second vibration driving signal may be supplied to the second electrode portion 131c of the vibration apparatus 130 through the terminal of the signal cable, the pad electrode of the pad portion, and a second power supply line.

According to an embodiment of the present disclosure, the vibration portion 131a may be provided as one body by the first and second cover members 131e and 131f, thereby providing the vibration apparatus 130 having a simplified structure and a thin thickness.

Referring to FIGS. 5A to 5F, a vibration portion 131a of a vibration apparatus 130 according to another embodiment of the present disclosure may include a first portion 131a1 and a second portion 131a2. The first electrode portion, the second electrode portion, the first cover member, the second cover member, the first adhesive layer, and the second adhesive layer described above with reference to FIG. 4 may be substantially identically configured.

The vibration portion 131a according to an embodiment of the present disclosure may include a plurality of first portions 131a1 and a plurality of second portions 131a2. The vibration portion 131a may include the plurality of first portions 131a1 and the plurality of second portions 131a2 between the plurality of first portions 131a1. Each of the plurality of first portions 131a1 may include one or more of a piezoelectric inorganic material and a piezoelectric organic material.

For example, the first portion 131a1 may include an inorganic material, and the second portion 131a2 may include an organic material. For example, the first portion 131a1 may have a piezoelectric material, and the second portion 131a2 may have a ductile characteristic or flexibility. For example, the inorganic material of the first portion 131a1 may have a piezoelectric characteristic, and the organic material of the second portion 131a2 may have a ductile characteristic or flexibility. For example, the plurality of first portions 131a1 and the plurality of second portions 131a2 may be alternately and repeatedly arranged in a second direction Y. Each of the plurality of first portions 131a1 may be disposed between two adjacent second portions 131a2 of the plurality of second portions 131a2.

Figure 5A:
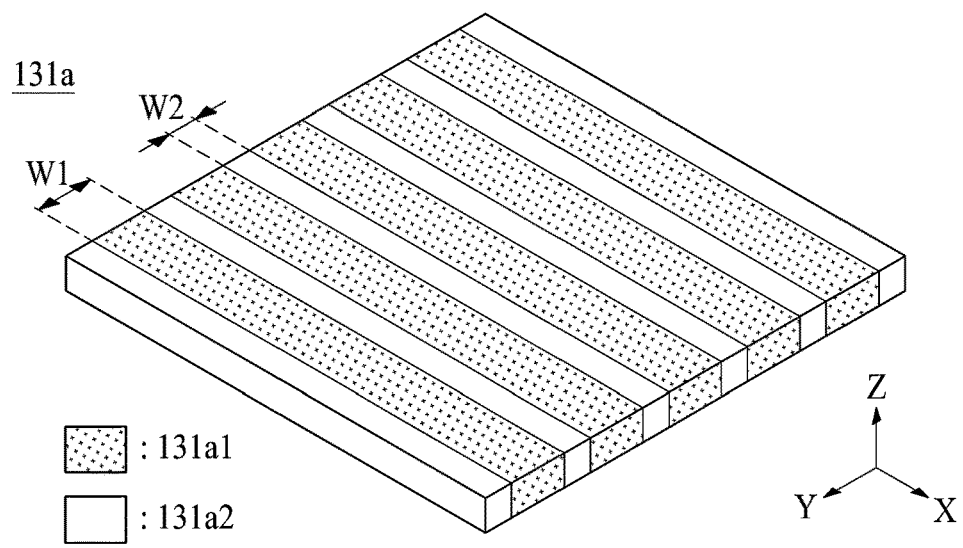
FIGS. 5A to 5F illustrate a vibration portion of a vibration apparatus according to an embodiment of the present disclosure.

Referring to FIG. 5A, each of the plurality of first portions 131a1 may have a first width W1 parallel to the second direction Y and a length parallel to the first direction X. Each of the plurality of second portions 131a2 may be disposed in parallel to the first direction X. For example, each of the plurality of second portions 131a2 may have a second width W2 and may have a length parallel to the first direction X. For example, each of the plurality of second portions 131a2 may have the same size (for example, width, area, or volume). For example, each of the plurality of second portions 131a2 may have the same size (for example, width, area, or volume) within a process error (or an allowable error or a tolerance error) occurring in a manufacturing process. The first width W1 may be the same as or different from the second width W2. For example, the first width W1 may be greater than the second width W2. For example, the first portion 131a1 and the second portion 131a2 may include a line shape or a stripe shape having the same size or different sizes. Accordingly, the vibration portion 131a illustrated in FIG. 5A may have a 2-2 composite structure, and thus, may have a resonance frequency of 20 kHz or less, but embodiments of the present disclosure are not limited thereto. For example, the resonance frequency of the vibration portion 131a may vary based on one or more of a shape, a length, and a thickness of the vibration portion.

For example, the first portion 131a1 may be a piezoelectric portion, a piezoelectric element, an inorganic portion, an inorganic material portion, a piezoelectric layer, a vibration layer, a displacement layer, or a displacement element, but the terms are not limited thereto. For example, the second portion 131a2 may be a ductile portion, an elastic portion, a flexible portion, an organic portion, an organic material portion, a damping portion, a bending portion, or a bounce portion, but the terms are not limited thereto.

Figure 5B:
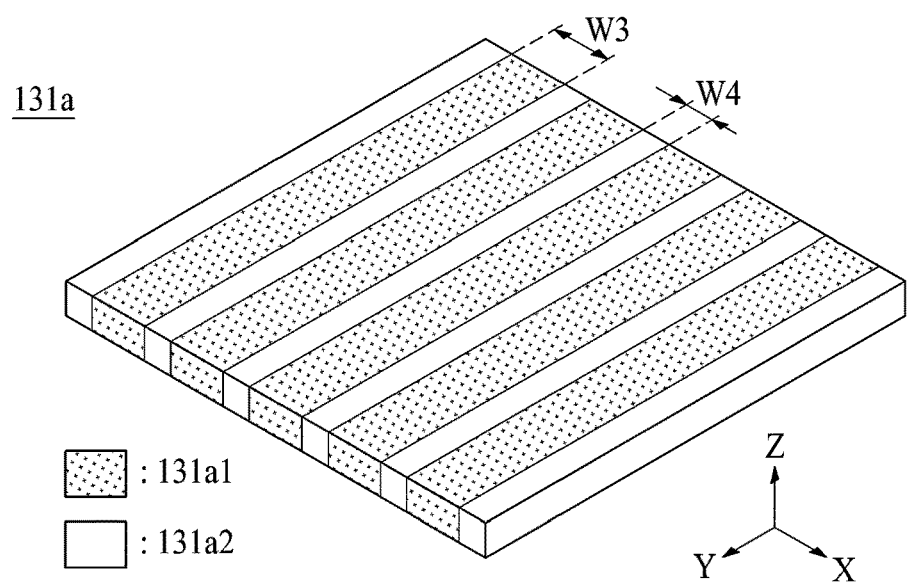

Referring to FIG. 5B, a vibration portion 131a according to another embodiment of the present disclosure may include a plurality of first portions 131a1 and a plurality of second portions 131a2 which are alternately and repeatedly arranged in a first direction X. Each of the plurality of first portions 131a1 may be disposed between two adjacent second portions 131a2 of the plurality of second portions 131a2. For example, each of the plurality of first portions 131a1 may have a third width W3 parallel to the first direction X and may have a length parallel to a second direction Y. Each of the plurality of second portions 131a2 may have a fourth width W4 parallel to the first direction X and may have a length parallel to the second direction Y. The third width W3 may be the same as or different from the fourth width W4. For example, the third width W3 may be greater than the fourth width W4. For example, the first portion 131a1 and the second portion 131a2 may include a line shape or a stripe shape having the same size or different sizes. Accordingly, the vibration portion 131a illustrated in FIG. 5B may have a 2-2 composite structure, and thus, may have a resonance frequency of 20 kHz or less, but embodiments of the present disclosure are not limited thereto. For example, the resonance frequency of the vibration portion 131a may vary based on one or more of a shape, a length, and a thickness of the vibration portion.

In the vibration portion 131a illustrated in FIGS. 5A and 5B, the plurality of first portions 131a1 and the plurality of second portions 131a2 may be disposed (or arranged) in parallel on the same plane (or the same layer). Each of the plurality of second portions 131a2 may be configured to fill a gap between two adjacent first portions 131a1. Each of the plurality of second portions 131a2 may be connected to or attached on an adjacent first portion 131a1. Accordingly, the vibration portion 131a may extend by a desired size or length based on lateral coupling (or lateral connection) of the first portion 131a1 and the second portion 131a2.

In the vibration portion (or the vibration layer) 131a illustrated in FIGS. 5A and 5B, the width W2 and the fourth width W4 of each of the plurality of second portions 131a2 may decrease progressively in a direction from a center portion of the vibration portion 131a or the vibration apparatus 130 to both edge portions (or both ends) thereof.

According to an embodiment of the present disclosure, when the vibration portion 131a or the vibration apparatus 130 vibrates in a vertical direction Z (or a thickness direction), a second portion 131a2 having a largest width W2 or W4 among the plurality of second portions 131a2 may be disposed at a portion on which a largest stress concentrates. When the vibration portion 131a or the vibration apparatus 130 vibrates in the vertical direction Z, a second portion 131a2 having a smallest width W2 or W4 among the plurality of second portions 131a2 may be disposed at a portion where a relatively smallest stress occurs. For example, the second portion 131a2 having the largest width W2 or W4 among the plurality of second portions 131a2 may be disposed at a center portion of the vibration portion 131a, and the second portion 131a2 having the smallest width W2 or W4 among the plurality of second portions 131a2 may be disposed at both edge portions of the vibration portion 131a. Accordingly, when the vibration portion 131a or the vibration apparatus 130 vibrates in the vertical direction Z, an overlap of a resonance frequency or interference of a sound wave occurring at a portion on which a largest stress concentrates may be minimized, and thus, dipping of a sound pressure level occurring in a low-pitched sound band may be reduced. For example, the flatness of a sound characteristic may be a magnitude of a deviation between a highest sound pressure level and a lowest sound pressure level.

In the vibration portion 131a illustrated in FIGS. 5A and 5B, the plurality of first portions 131a1 may have different sizes (or widths). For example, a size (or a width) of each of the plurality of first portions 131a1 may decrease or increase progressively in a direction from the center portion of the vibration portion 131a or the vibration apparatus 130 to both edge portions (or both ends or both periphery portions) thereof. In this case, a sound pressure level characteristic of a sound of the vibration portion 131a may be enhanced by various unique vibration frequencies based on vibrations of the plurality of first portions 131a1 having different sizes, and a reproduction band of a sound may extend.

Figure 5C:
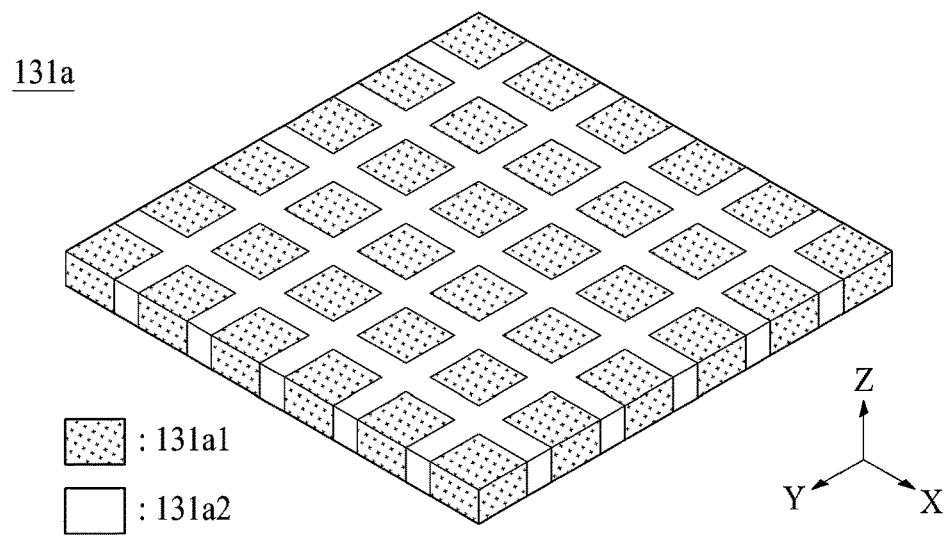

Referring to FIG. 5C, a vibration portion 131a according to another embodiment of the present disclosure may include a plurality of first portions 131a1 which are apart from one another in a first direction X and a second direction Y and a second portion 131a2 disposed between the plurality of first portions 131a1. The plurality of first portions 131a1 may be disposed apart from one another in each of the first direction X and the second direction Y. For example, the plurality of first portions 131a1 may have a hexahedral shape having the same size and may be arranged in a lattice shape. The second portion 131a2 may be disposed between the plurality of first portions 131a1 in each of the first direction X and the second direction Y. The second portion 131a2 may be configured to fill a gap between two adjacent first portions 131a1 or to surround each of the plurality of first portions 131a1. Therefore, the second portion 131a2 may be connected to or attached on an adjacent first portion 131a1. For example, a width of the second portion 131a2 disposed between two first portions 131a1 adjacent to each other in the first direction X may be the same as or different from that of the first portion 131a1, and a width of a second portion 131a2 disposed between two first portions 131a1 adjacent to each other in the second direction Y may be the same as or different from that of the first portion 131a1. Accordingly, the vibration portion 131a illustrated in FIG. 5C may have a resonance frequency of 30 MHz or less based on a 1-3 composite structure. However, embodiments of the present disclosure are not limited thereto, and the resonance frequency of the vibration portion 131a may vary based on one or more of a shape, a length, and a thickness of the vibration portion.

Figure 5D:
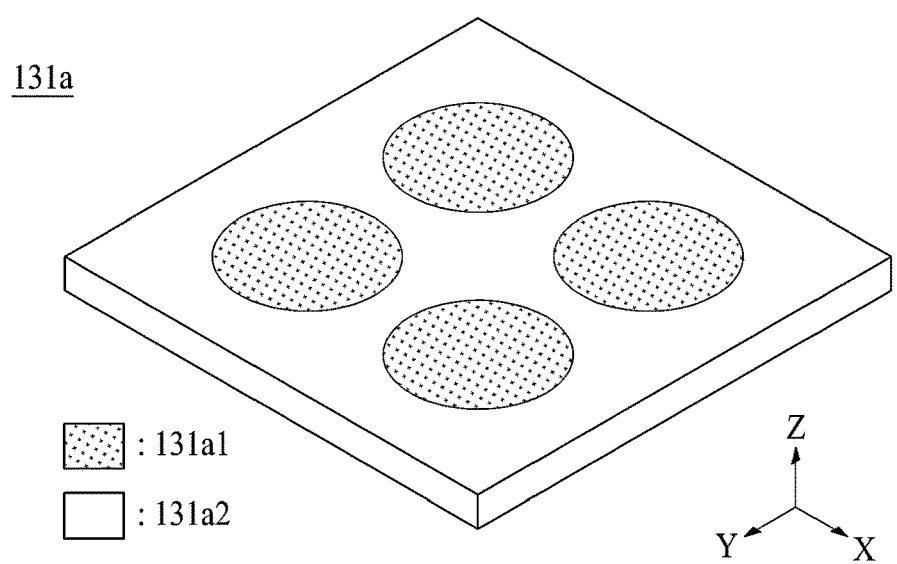

Referring to FIG. 5D, a vibration portion 131a according to another embodiment of the present disclosure may include a plurality of first portions 131a1 which are apart from one another in a first direction X and a second direction Y and a second portion 131a2 which surrounds each of the plurality of first portions 131a1. Each of the plurality of first portions 131a1 may have a planar structure having a circular shape. For example, each of the plurality of first portions 131a1 may have a circular plate shape, but embodiments of the present disclosure are not limited thereto. For example, each of the plurality of first portions 131a1 may have a dot shape including an oval shape, a polygonal shape, or a donut shape. The second portion 131a2 may be configured to surround each of the plurality of first portions 131a1. Therefore, the second portion 131a2 may be connected to or attached on a lateral surface of each of the plurality of first portions 131a1. The plurality of first portions 131a1 and the second portion 131a2 may be disposed (or arranged) in parallel on the same plane (or the same layer). Accordingly, the vibration portion 131a illustrated in FIG. 5D may be implemented as a vibration source (or a vibration element) having a circular shape to have a 1-3 composite structure, and thus, may have a resonance frequency of 30 MHz or less, thereby enhancing a vibration characteristic or a sound output characteristic. However, embodiments of the present disclosure are not limited thereto, and the resonance frequency of the vibration portion 131a may vary based on one or more of a shape, a length, and a thickness of the vibration portion.

Figure 5E:
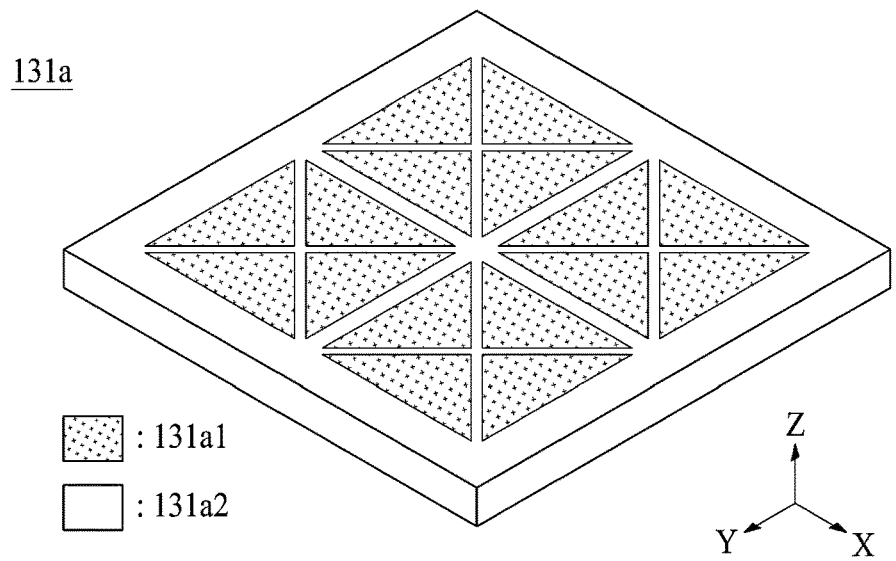

Referring to FIG. 5E, a vibration portion 131a according to another embodiment of the present disclosure may include a plurality of first portions 131a1 which are apart from one another in a first direction X and a second direction Y and a second portion 131a2 which surrounds each of the plurality of first portions 131a1. Each of the plurality of first portions 131a1 may have a planar structure having a triangular shape. For example, each of the plurality of first portions 131a1 may have a triangular plate shape.

For example, four adjacent first portions 131a1 of the plurality of first portions 131a1 may be disposed adjacent to one another to form a tetragonal shape (or a square shape). A vertex of each of four adjacent first portions 131a1 forming a tetragonal shape may be disposed adjacent to a middle portion (or a center portion) of a tetragonal shape. The second portion 131a2 may be configured to surround each of the plurality of first portions 131a1. Therefore, the second portion 131a2 may be connected to or attached on a lateral surface of each of the plurality of first portions 131a1. The plurality of first portions 131a1 and the second portion 131a2 may be disposed (or arranged) in parallel on the same plane (or the same layer). Accordingly, the vibration portion 131a illustrated in FIG. 5E may be implemented as a vibration source (or a vibration element) having a square shape to have a 1-3 composite structure, and thus, may have a resonance frequency of 30 MHz or less, thereby enhancing a vibration characteristic or a sound output characteristic. However, embodiments of the present disclosure are not limited thereto, and the resonance frequency of the vibration portion 131a may vary based on one or more of a shape, a length, and a thickness of the vibration portion.

Figure 5F:
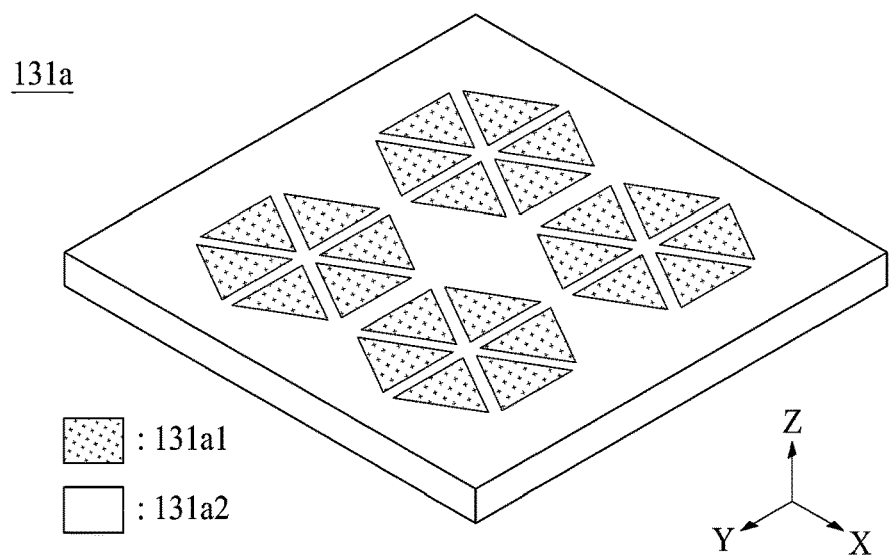

According to another embodiment of the present disclosure, as illustrated in FIG. 5F, six adjacent first portions 131a1 of the plurality of first portions 131a1 may be disposed adjacent to one another to form a hexagonal shape (or a regular hexagon). A vertex of each of six adjacent first portions 131a1 forming a hexagonal shape may be disposed adjacent to a middle portion (or a center portion) of a hexagonal shape. The second portion 131a2 may be configured to surround each of the plurality of first portions 131a1. Therefore, the second portion 131a2 may be connected to or attached on a lateral surface of each of the plurality of first portions 131a1. The plurality of first portions 131a1 and the second portion 131a2 may be disposed (or arranged) in parallel on the same plane (or the same layer). Accordingly, the vibration portion 131a illustrated in FIG. 5F may be implemented as a vibration source (or a vibration element) having a regular hexagon shape to have a 1-3 composite structure, and thus, may have a resonance frequency of 30 MHz or less, thereby enhancing a vibration characteristic or a sound output characteristic. However, embodiments of the present disclosure are not limited thereto, and the resonance frequency of the vibration portion 131a may vary based on one or more of a shape, a length, and a thickness of the vibration portion.

Referring to FIGS. 5E and 5F, 2N (where N is a natural number of 2 or more) adjacent first portions 131a1 of a plurality of first portions 131a1 having a triangular shape may be arranged adjacent to one another to form a 2N-angular shape.

In FIGS. 5E and 5F, each of the plurality of first portions 131a1 according to an embodiment of the present disclosure may include an inorganic material portion. The inorganic material portion may include a piezoelectric material or an electro active material. The piezoelectric material or the electro active material may have a characteristic where pressure or twisting is applied to a crystalline structure by an external force, a potential difference occurs due to dielectric polarization caused by a relative position change of a positive (+) ion and a negative (−) ion, and a vibration is generated by an electric field based on a voltage applied thereto. Referring to FIG. 4, a first surface of each of the plurality of first portions 131a1 may be electrically connected to the first electrode portion 131b, and a second surface of each of the plurality of first portions 131a1 may be electrically connected to the second electrode portion 131c.

Figure 6:
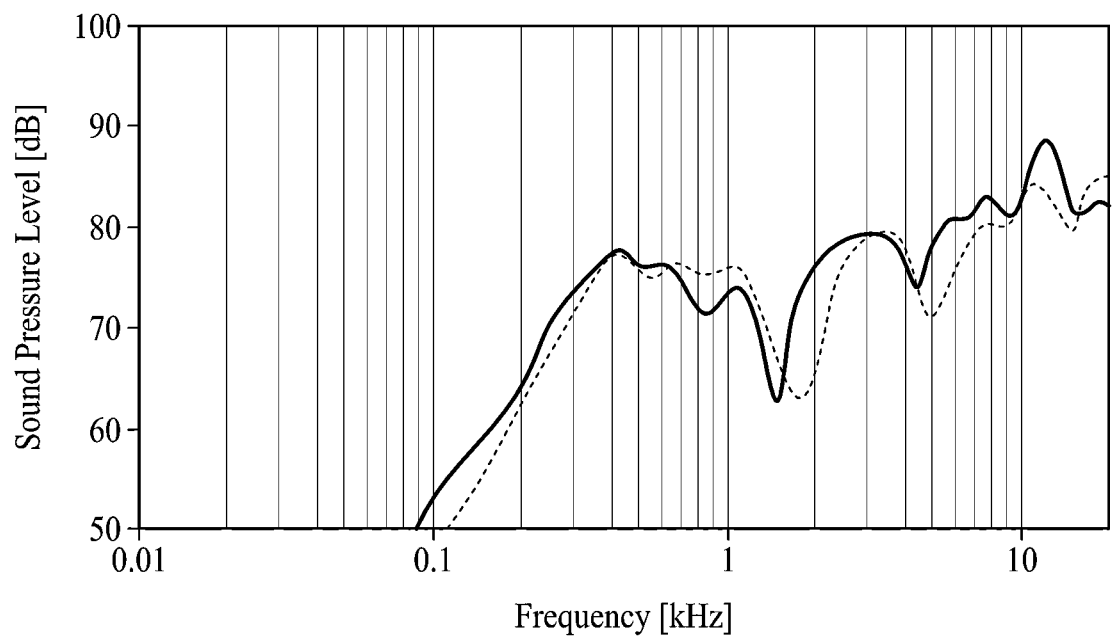
FIG. 6 illustrates a sound output characteristic according to an experiment example of the present disclosure.

FIG. 6 illustrates a sound output characteristic according to an experiment example of the present disclosure.

A sound output characteristic may be measured by a sound analysis apparatus. The sound analysis apparatus may be B&K audio measurement equipment. The sound analysis apparatus may include a sound card which transmits or receives a sound to or from a control personal computer (PC), an amplifier which amplifies a signal generated from the sound card and transfers the amplified signal to a vibration apparatus, and a microphone which collects a sound generated by the vibration apparatus in a display panel. For example, the microphone may be disposed at a center of the vibration apparatus, and a distance between the display panel and the microphone may be about 50 cm. A sound may be measured in a state where the microphone is vertical to the vibration apparatus. The sound collected by the microphone may be input to the control PC through the sound card, and the sound of the vibration apparatus may be analyzed through checking in a control program. For example, a frequency response characteristic of a frequency range of 20 Hz to 20 kHz may be measured by using a pulse program. In sine sweep of 0.15 kHz to 20 kHz, measurement has been performed by applying octave smoothing.

In FIG. 6, the abscissa axis represents a frequency (Hz (hertz)), and the ordinate axis represents a sound pressure level SPL (dB (decibel)).

In FIG. 6, a dotted line represents a case where a thickness of the adhesive layer 12 of FIG. 3 is 200 μm, and a solid line represents a case where a thickness of the adhesive layer 12 of FIG. 3 is 63 μm. The adhesive layer 12 may be configured with PSA, and a modulus may be 105 Pa.

Referring to FIG. 6, it has been measured that a sound wave varies based on a thickness of the adhesive layer 12 between the vibration apparatus 130 and the second supporting member 20. It may be seen that a sound pressure level characteristic is changed based on a thickness of the adhesive layer 12, but in the solid line and the dotted line, it may be seen that a sound pressure level is reduced in a low-pitched sound band. For example, the low-pitched sound band may be 300 Hz or less, but embodiments of the present disclosure are not limited thereto.

Referring to FIG. 6, it may be seen that a desired sound pressure level cannot be output even when the vibration apparatus 130 is provided under the display panel 30. For example, it may be seen that a desired sound pressure level characteristic and/or a desired sound characteristic cannot be output by the vibration apparatus 130 in a pitched sound band including the low-pitched sound band.

Figure 7:
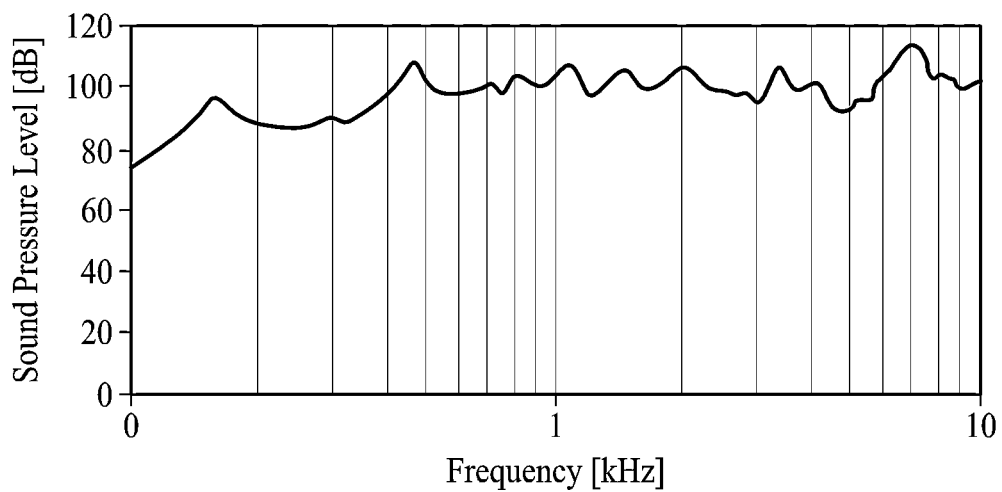
FIG. 7 illustrates a sound output characteristic according to an embodiment of the present disclosure.

FIG. 7 illustrates a sound output characteristic according to an embodiment of the present disclosure.

A method of measuring a sound output characteristic may be the same as details described above with reference to FIG. 6, and thus, a description thereof is omitted.

In FIG. 7, the abscissa axis represents a frequency (Hz), and the ordinate axis represents a sound pressure level SPL (dB).

FIG. 7 illustrates an embodiment where a vibration transfer member is included in each of the first to fifth adhesive members in the apparatus 1 of FIG. 3. The vibration transfer member may be a piezoelectric material, and the piezoelectric material may have a content of 6 wt % to 10 wt % with respect to the first to fifth adhesive members.

Referring to FIG. 7, comparing to FIG. 6, it may be seen that a uniform sound pressure level characteristic is realized in a total frequency band. The apparatus according to an embodiment of the present disclosure may enhance a sound characteristic of the low-pitched sound band and a sound pressure level characteristic of the low-pitched sound band and may enhance the flatness of a sound characteristic. Here, the flatness of a sound characteristic may be a magnitude of a deviation between a highest sound pressure level and a lowest sound pressure level. In a case where contents of vibration transfer members included in the first to fifth adhesive members in the apparatus of FIG. 3 are differently adjusted, a sound output characteristic similar to FIG. 7 may be realized.

According to an embodiment of the present disclosure, a vibration transfer member may be provided in one or more of the first to fifth adhesive members 91 to 95, thereby providing an apparatus for enhancing a sound pressure level in a total pitched sound band including the low-pitched sound band. For example, when a piezoelectric material is included as a vibration transfer member in one or more of the first to fifth adhesive members 91 to 95, an apparatus for enhancing a sound pressure level in a total pitched sound band including the low-pitched sound band may be provided. For example, when a piezoelectric material is included as a vibration transfer member in one or more of the first to fifth adhesive members 91 to 95, a reduction in a sound pressure level in the low-pitched sound band in FIG. 6 may be solved by the piezoelectric material which is the vibration transfer member, thereby providing an apparatus for enhancing a sound pressure level in a total pitched sound band. For example, a piezoelectric material may be included as a vibration transfer member in one or more of the first to fifth adhesive members 91 to 95, and thus, an apparatus for enhancing a sound pressure level in a total pitched sound band including the low-pitched sound band may be provided.

According to an embodiment of the present disclosure, because a vibration transfer member is provided in one or more of the first to fifth adhesive members 91 to 95 and the vibration transfer members are configured to have different contents and/or have different contents based on a shape of the vibration transfer member, a vibration of the vibration apparatus 130 may be transferred to the display panel 30 and/or the front member 60 without being lost. Also, the display performance and/or reliability of the display panel 30 may not be reduced, and an adverse effect thereof on the polarization performance of the polarization member 40 disposed on the display panel 30 may be minimized.

A vibration apparatus according to an embodiment of the present disclosure may be applied to a vibration apparatus provided in the apparatus. The apparatus according to an embodiment of the present disclosure may be applied to mobile devices, video phones, smart watches, watch phones, wearable devices, foldable devices, rollable devices, bendable devices, flexible devices, curved devices, portable multimedia players (PMPs), personal digital assistants (PDAs), electronic organizers, desktop personal computers (PCs), laptop PCs, netbook computers, workstations, navigation devices, automotive navigation devices, automotive display apparatuses, televisions (TVs), wall paper display apparatuses, signage devices, game machines, notebook computers, monitors, cameras, camcorders, home appliances, etc. Also, the vibration generating module according to the present disclosure may be applied to organic light emitting lighting devices or inorganic light emitting lighting devices. Also, the vibration apparatus according to the present disclosure may be applied to organic light emitting lighting devices or inorganic light emitting lighting devices. In a case where the vibration apparatus is applied to a lighting device, the vibration apparatus may act as lighting and a speaker. Also, in a case where the vibration apparatus according to the present disclosure is applied to a mobile device, the vibration apparatus may be one or more of a speaker, a receiver, or a haptic, but embodiments of the present disclosure are not limited thereto.

An apparatus according to an embodiment of the present disclosure will be described below.

An apparatus according to an embodiment of the present disclosure includes a display member displaying an image, a front member at a front surface of the display member, a vibration apparatus at a rear surface of the display member, and an adhesive member between the display member and the front member, wherein the adhesive member includes a piezoelectric material.

According to some embodiments of the present disclosure, the vibration apparatus may include a vibration portion, a first electrode portion at a first surface of the vibration portion, and a second electrode portion at a surface, differing from the first surface, of the vibration portion.

According to some embodiments of the present disclosure, the vibration portion may include one or more of a piezoelectric inorganic material and a piezoelectric organic material.

According to some embodiments of the present disclosure, the vibration portion may include a plurality of first portions and a plurality of second portions between the plurality of first portions, the plurality of second portions may include an organic material, and each of the plurality of first portions may include one or more of a piezoelectric inorganic material and a piezoelectric organic material.

According to some embodiments of the present disclosure, the apparatus may further include a first cover member in the first electrode portion and a second cover member in the second electrode portion.

An apparatus according to another embodiment of the present disclosure includes a display member including a plurality of pixels arranged on a flexible substrate, a vibration apparatus under the display member, a front member on the display member, and a vibration transfer member between the display member and the front member, wherein the vibration transfer member includes a piezoelectric material.

According to some embodiments of the present disclosure, each of the front member, the display member, and the vibration apparatus may be capable of being bent in a curved shape.

According to some embodiments of the present disclosure, the vibration portion may include a plurality of second portions including an organic material, and a plurality of first portions between the plurality of second portions, and each of the plurality of first portions may include one or more of a piezoelectric inorganic material and a piezoelectric organic material.

According to some embodiments of the present disclosure, the apparatus may further include an adhesive member between the display member and the front member, the adhesive member may include the vibration transfer member.

According to some embodiments of the present disclosure, the display member may include a display panel including a plurality of pixels configured to display an image, a first supporting member between a rear surface of the display panel and the vibration apparatus, a second supporting member between the first supporting member and the vibration apparatus, and a polarization member between a front surface of the display panel and the front member, the adhesive member may include a first adhesive member between the first supporting member and the second supporting member, a second adhesive member between the display panel and the first supporting member, a third adhesive member between the display panel and the polarization member, and a fourth adhesive member between the polarization member and the front member, one or more of the first to fourth adhesive members may include the piezoelectric material.

According to some embodiments of the present disclosure, the piezoelectric material may be added to the first to fourth adhesive members by different contents.

According to some embodiments of the present disclosure, a content of the piezoelectric material included in each of the first to fourth adhesive members may be reduced progressively toward the front member from the vibration apparatus.

According to some embodiments of the present disclosure, the display member may include a display panel including a plurality of pixels configured to display an image, and the adhesive member may be between a front surface of the display panel and the front member.

According to some embodiments of the present disclosure, the display member may include a display panel including a plurality of pixels configured to display an image, and a polarization member between a front surface of the display panel and the front member, the adhesive member may include a third adhesive member between the display panel and the polarization member; and a fourth adhesive member between the polarization member and the front member, one or more of the third and fourth adhesive members may include the piezoelectric material.

According to some embodiments of the present disclosure, each of the third and fourth adhesive members may include the piezoelectric material, and contents of piezoelectric materials included in the third and fourth adhesive members differ.

According to some embodiments of the present disclosure, a content of the piezoelectric material included in the third adhesive member may be less than a content of the piezoelectric material included in the fourth adhesive member.

According to some embodiments of the present disclosure, the display member may further include a first layer between a front surface of the display panel and the front member, the adhesive member may further include a fifth adhesive member between the front member and the first layer, the fourth adhesive member may be between the polarization member and the first layer.

According to some embodiments of the present disclosure, the fifth adhesive member may include the piezoelectric material.

According to some embodiments of the present disclosure, each of the third to fifth adhesive members may include the piezoelectric material, and contents of piezoelectric materials included in the third to fifth adhesive members differ.

According to some embodiments of the present disclosure, a content of the piezoelectric material included in each of the third to fifth adhesive members may be reduced progressively toward the front member from the vibration apparatus.

An apparatus according to another embodiment of the present disclosure includes a display panel configured to display an image, a vibration apparatus at a rear surface of the display panel, a supporting member between a rear surface of the display panel and the vibration apparatus, and a first adhesive member between the display panel and the supporting member, the first adhesive member including a piezoelectric material.

According to some embodiments of the present disclosure, the apparatus may further include a first adhesive member between the display panel and the supporting member, the first adhesive member including a piezoelectric material.

According to some embodiments of the present disclosure, the apparatus may further include a front member at a front surface of the display panel and a second adhesive member between the display panel and the front member, the second adhesive member including a piezoelectric material.

According to some embodiments of the present disclosure, a content of the piezoelectric material in the second adhesive member may be less than a content of the piezoelectric material in the first adhesive member.

According to some embodiments of the present disclosure, the front member may be at least one of a polarization member and a cover window.

According to some embodiments of the present disclosure, at least one of the first adhesive member and the second adhesive member may further include an optically transparent adhesive member.

According to some embodiments of the present disclosure, each of the front member, the display panel, the supporting member and the vibration apparatus may be capable of being bent in a curved shape.

According to some embodiments of the present disclosure, the piezoelectric material may include a particle shape and a wire shape, and a content of the particle shape and/or the wire shape may be differently adjusted in the first adhesive member and the second adhesive member.

According to embodiments of the present disclosure, a vibration apparatus which vibrates a display member may be provided, and a vibration transfer member including a piezoelectric material may be provided, thereby providing an apparatus for generating a sound so that the sound travels in a forward direction of the apparatus.

According to embodiments of the present disclosure, a vibration apparatus which vibrates a display member may be provided, and a vibration transfer member including a piezoelectric material may be provided, thereby providing an apparatus for enhancing a sound characteristic and/or a sound pressure level characteristic in a pitched sound band including a low-pitched sound band.

It will be apparent to those skilled in the art that various modifications and variations can be made in the apparatus of present disclosure without departing from the technical idea or the scope of the disclosure. Thus, it is intended that the present disclosure cover the modifications and variations of this disclosure provided they come within the scope of the appended claims and their equivalents.

What is claimed is:

1. An apparatus, comprising:
a display member configured to display an image;
a front member at a front surface of the display member;
a vibration apparatus at a rear surface of the display member;
at least one rear adhesive member between the display member and the vibration apparatus; and
at least one front adhesive member between the display member and the front member,
wherein the at least one rear adhesive member and the at least one front adhesive member include piezoelectric materials having different contents.

2. The apparatus of claim 1, wherein the vibration apparatus comprises:
a vibration portion;
a first electrode portion at a first surface of the vibration portion; and
a second electrode portion at a surface differing from the first surface of the vibration portion.

3. The apparatus of claim 2, wherein the vibration portion comprises one or more of a piezoelectric inorganic material and a piezoelectric organic material.

4. The apparatus of claim 2, wherein the vibration portion comprises a plurality of first portions and a plurality of second portions between the plurality of first portions,
wherein the plurality of second portions comprises an organic material, and
wherein each of the plurality of first portions comprises one or more of a piezoelectric inorganic material and a piezoelectric organic material.

5. The apparatus of claim 2, further comprising:
a first cover member at the first electrode portion; and
a second cover member at the second electrode portion.

6. The apparatus of claim 1, wherein:
the display member comprises:
a display panel including a plurality of pixels configured to display an image;
a first supporting member between a rear surface of the display panel and the vibration apparatus;
a second supporting member between the first supporting member and the vibration apparatus; and
a polarization member between a front surface of the display panel and the front member,
the at least one rear adhesive member comprises:
a first adhesive member between the first supporting member and the second supporting member; and
a second adhesive member between the display panel and the first supporting member,
the at least one front adhesive member comprises:
a third adhesive member between the display panel and the polarization member; and a fourth adhesive member between the polarization member and the front member, and one or more of the first to fourth adhesive members comprise a piezoelectric material among the piezoelectric materials having different contents.

7. The apparatus of claim 6, wherein the piezoelectric material is added to the first to fourth adhesive members by different contents.

8. The apparatus of claim 7, wherein a content of the piezoelectric material included in each of the first to fourth adhesive members is reduced progressively toward the front member from the vibration apparatus.

9. The apparatus of claim 1, wherein:
the display member comprises:
a display panel including a plurality of pixels configured to display an image; and
a polarization member between a front surface of the display panel and the front member,
the at least one front adhesive member is between the polarization member and the front member.

10. The apparatus of claim 1, wherein:
the display member comprises:
a display panel including a plurality of pixels configured to display an image; and
a polarization member between a front surface of the display panel and the front member,
the at least one front adhesive member comprises:
a third adhesive member between the display panel and the polarization member; and
a fourth adhesive member between the polarization member and the front member, and
one or more of the third and fourth adhesive members comprise a piezoelectric material among the piezoelectric materials having different contents.

11. The apparatus of claim 10, wherein:
each of the third and fourth adhesive members comprises the piezoelectric material; and
contents of the piezoelectric materials respectively in the third and fourth adhesive members differ from each other.

12. The apparatus of claim 11, wherein a content of the piezoelectric material in the third adhesive member is less than a content of the piezoelectric material in the fourth adhesive member.

13. The apparatus of claim 12, further comprising:
a first layer between a front surface of the display panel and the front member; and
a fifth adhesive member between the front member and the first layer,
wherein the fourth adhesive member is between the polarization member and the first layer.

14. The apparatus of claim 13, wherein the fifth adhesive member comprises one of the piezoelectric materials.

15. The apparatus of claim 13, wherein:
each of the third to fifth adhesive members comprises one of the piezoelectric materials; and
contents of the piezoelectric materials included respectively in the third to fifth adhesive members differ from one another.

16. The apparatus of claim 15, wherein a content of the piezoelectric material included in each of the third to fifth adhesive members is reduced progressively toward the front member from the vibration apparatus.

17. An apparatus, comprising:
a display member including a plurality of pixels arranged over a flexible substrate;
a vibration apparatus under the display member;
a front member at the display member;
at least one first vibration transfer member between the display member and the vibration apparatus; and
at least one second vibration transfer member between the display member and the front member,
wherein the at least one first vibration transfer member and the at least one second vibration transfer member include piezoelectric materials having different contents.

18. The apparatus of claim 17, wherein each of the front member, the display member, and the vibration apparatus is capable of being bent in a curved shape.

19. The apparatus of claim 17, wherein:
the vibration apparatus comprises:
a plurality of second portions including an organic material; and
a plurality of first portions between the plurality of second portions, and
each of the plurality of first portions comprises one or more of a piezoelectric inorganic material and a piezoelectric organic material.

20. The apparatus of claim 17, further comprising:
at least one rear adhesive member between the display member and the vibration apparatus; and
at least one front adhesive member between the display member and the front member,
wherein the at least one rear adhesive member comprises the at least one first vibration transfer member, and
wherein the at least one front adhesive member comprises the at least one second vibration transfer member.

21. The apparatus of claim 20, wherein:
the display member comprises:
a display panel including a plurality of pixels configured to display an image;
a first supporting member between a rear surface of the display panel and the vibration apparatus;
a second supporting member between the first supporting member and the vibration apparatus; and
a polarization member between a front surface of the display panel and the front member,
the at least one rear adhesive member comprises:
a first adhesive member between the first supporting member and the second supporting member; and
a second adhesive member between the display panel and the first supporting member,
the at least one front adhesive member comprises:
a third adhesive member between the display panel and the polarization member; and
a fourth adhesive member between the polarization member and the front member, and
one or more of the first to fourth adhesive members comprise a piezoelectric material among the piezoelectric materials having different contents.

22. The apparatus of claim 21, wherein the piezoelectric material is added to the first to fourth adhesive members by different contents.

23. The apparatus of claim 22, wherein a content of the piezoelectric material included in each of the first to fourth adhesive members is reduced progressively toward the front member from the vibration apparatus.

24. The apparatus of claim 20, wherein:
the display member comprises:
a display panel including a plurality of pixels configured to display an image; and
a polarization member between a front surface of the display panel and the front member, the at least one front adhesive member is between the polarization member and the front member.

25. The apparatus of claim 20, wherein:
the display member comprises:
a display panel including a plurality of pixels configured to display an image; and
a polarization member between a front surface of the display panel and the front member,
the at least one front adhesive member comprises:
a third adhesive member between the display panel and the polarization member; and
a fourth adhesive member between the polarization member and the front member, and
one or more of the third and fourth adhesive members comprise a piezoelectric material among the piezoelectric materials having different contents.

26. The apparatus of claim 25, wherein:
each of the third and fourth adhesive members comprises the piezoelectric material; and
contents of the piezoelectric materials respectively in the third and fourth adhesive members differ from each other.

27. The apparatus of claim 26, wherein a content of the piezoelectric material in the third adhesive member is less than a content of the piezoelectric material in the fourth adhesive member.

28. The apparatus of claim 25, further comprising:
a first layer between a front surface of the display panel and the front member; and
a fifth adhesive member between the front member and the first layer,
wherein the fourth adhesive member is between the polarization member and the first layer.

29. The apparatus of claim 28, wherein the fifth adhesive member comprises one of the piezoelectric materials.

30. The apparatus of claim 28, wherein:
each of the third to fifth adhesive members comprises one of the piezoelectric materials; and
contents of the piezoelectric materials included respectively in the third to fifth adhesive members differ from one another.

31. The apparatus of claim 30, wherein a content of the piezoelectric material included in each of the third to fifth adhesive members is reduced progressively toward the front member from the vibration apparatus.

32. An apparatus, comprising:
a display panel configured to display an image;
a vibration apparatus at a rear surface of the display panel;
a supporting member between a rear surface of the display panel and the vibration apparatus;
at least one first adhesive member between the display panel and the supporting member; and
at least one second adhesive member between the display member and the front member,
wherein the at least one first adhesive member and the at least one second adhesive member include piezoelectric materials having different contents.

33. The apparatus of claim 32, further comprising:
a front member at a front surface of the display panel,
wherein the at least one second adhesive member is between the display panel and the front member, the at least one second adhesive member including a piezoelectric material among the piezoelectric materials having different contents.

34. The apparatus of claim 33, wherein a content of the piezoelectric material in the at least one second adhesive member is less than a content of the piezoelectric material in the at least one first adhesive member.

35. The apparatus of claim 33, wherein the front member is at least one of a polarization member and a cover window.

36. The apparatus of claim 33, wherein at least one of the at least one first adhesive member and the at least one second adhesive member further includes an optically transparent adhesive member.

37. The apparatus of claim 32, wherein each of the front member, the display panel, the supporting member and the vibration apparatus is capable of being bent in a curved shape.

38. The apparatus of claim 32, wherein the piezoelectric materials include a particle shape and a wire shape, and a content of the particle shape and/or the wire shape is differently adjusted in the at least one first adhesive member and the at least one second adhesive member.

* * * * *